United States Patent
Imada et al.

(10) Patent No.: US 8,164,166 B2
(45) Date of Patent: Apr. 24, 2012

(54) INTERFACIAL ROUGHNESS REDUCING FILM, WIRING LAYER, SEMICONDUCTOR DEVICE, AND METHOD OF MANUFACTURING SEMICONDUCTOR DEVICE

(75) Inventors: Tadahiro Imada, Kawasaki (JP);
Yoshihiro Nakata, Kawasaki (JP);
Kouta Yoshikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 881 days.

(21) Appl. No.: 12/238,056

(22) Filed: Sep. 25, 2008

(65) Prior Publication Data

US 2009/0085170 A1    Apr. 2, 2009

(30) Foreign Application Priority Data

Sep. 27, 2007   (JP) ................. 2007-250725

(51) Int. Cl.
*H01L 23/58* (2006.01)
*H01L 21/31* (2006.01)
*B32B 3/10* (2006.01)

(52) U.S. Cl. ..................................... 257/629

(58) Field of Classification Search ........ 257/E21.575–E21.597, E21.627, 257/E21.641, 774, E29.01, E23.141, E23.143, 257/E23.169, E23.175, E23.178, 621, 629, 257/E21.24, E23.001; 428/195.1, 446, 447, 428/209; 556/410, 488; 438/629, 630, 637–640, 438/668, 672, 675, 778

See application file for complete search history.

(56) References Cited

U.S. PATENT DOCUMENTS

| | | | | |
|---|---|---|---|---|
| 5,853,808 A | * | 12/1998 | Arkles et al. | 427/377 |
| 6,599,846 B2 | * | 7/2003 | Komatsu et al. | 438/781 |
| 6,770,572 B1 | | 8/2004 | Wu et al. | |
| 6,780,498 B2 | * | 8/2004 | Nakata et al. | 428/312.6 |
| 2005/0095840 A1 | | 5/2005 | Bhanap et al. | |
| 2005/0131190 A1 | * | 6/2005 | Lee et al. | 528/35 |
| 2006/0040110 A1 | | 2/2006 | Kohmura et al. | |
| 2007/0026689 A1 | * | 2/2007 | Nakata et al. | 438/781 |
| 2007/0232075 A1 | | 10/2007 | Imada et al. | |
| 2008/0142474 A1 | * | 6/2008 | Kim et al. | 216/6 |
| 2008/0290522 A1 | * | 11/2008 | Ohnishi et al. | 257/759 |

FOREIGN PATENT DOCUMENTS

| | | |
|---|---|---|
| JP | 6-267946 A | 9/1994 |
| JP | 2004-511896 A | 4/2004 |
| JP | 2004-513503 A | 4/2004 |
| JP | 2004-292304 A | 10/2004 |
| JP | 2007-508691 A | 4/2007 |
| JP | 2007-294854 A | 11/2007 |
| WO | 02/01621 A2 | 1/2002 |

* cited by examiner

*Primary Examiner* — Dao H Nguyen
*Assistant Examiner* — Tram H Nguyen
(74) *Attorney, Agent, or Firm* — Westerman, Hattori, Daniels & Adrian, LLP

(57) ABSTRACT

An interfacial roughness reducing film which is in contact, on one side thereof, with an insulating film and in contact, on a side opposite from the one side, with wiring comprises a Si—O bond, and is formed using a composition containing a silicon compound that comprises at least one bond of Si—N bonds and Si—Cl bonds wherein the number of Si—N bonds and Si—Cl bonds combined per molecule of the compound is at least two. An interfacial roughness between the interfacial roughness reducing film and the wiring is smaller than that between the interfacial roughness reducing film and the insulating film.

16 Claims, 11 Drawing Sheets

STEP 18

FIG.1
STEP 1
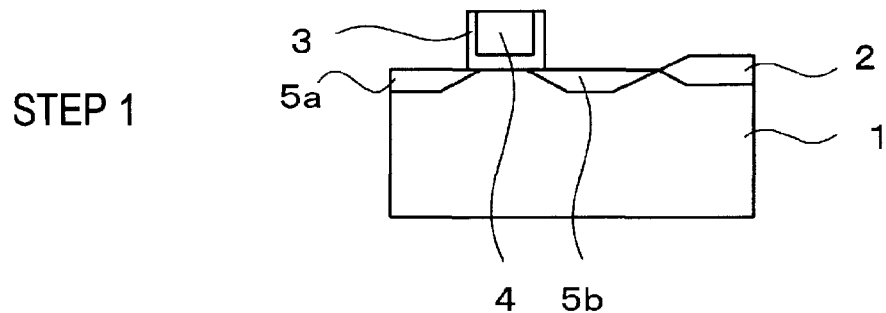
STEP 2
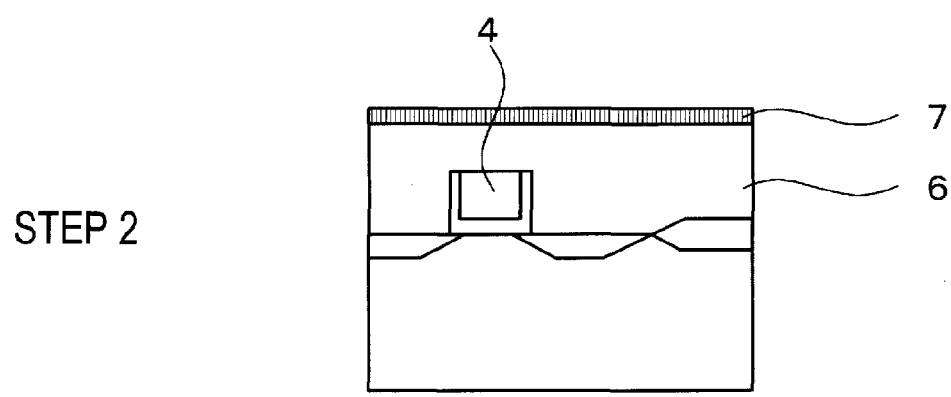
STEP 3
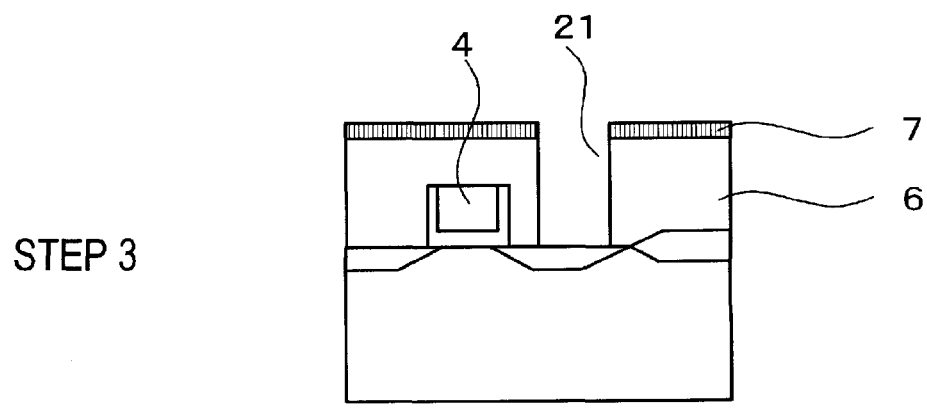

FIG.2
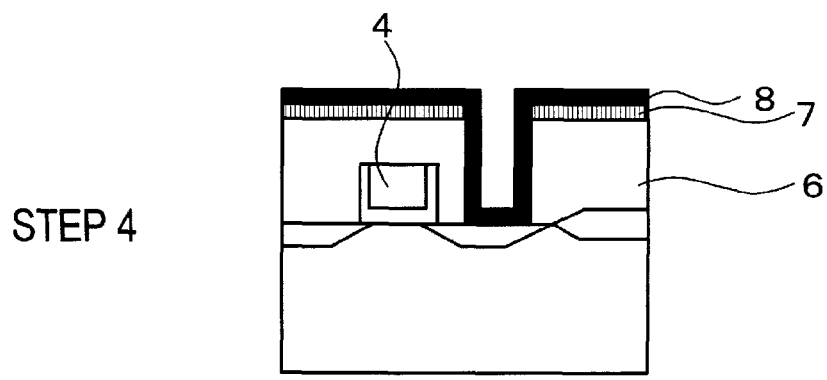
STEP 4
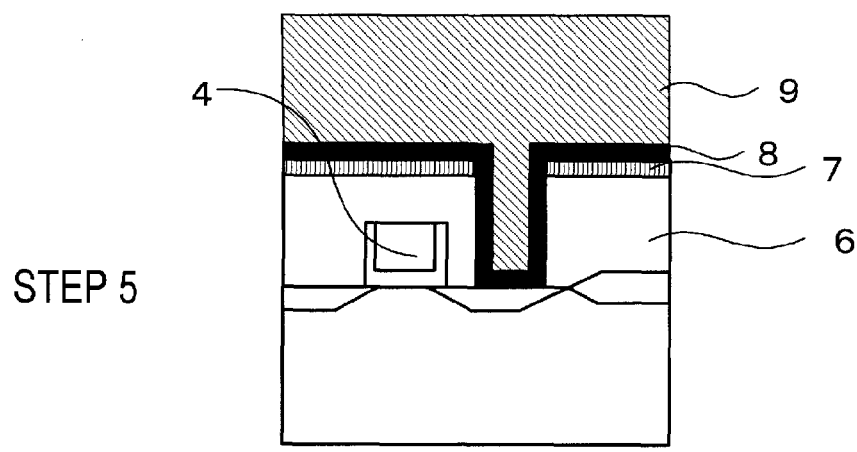
STEP 5
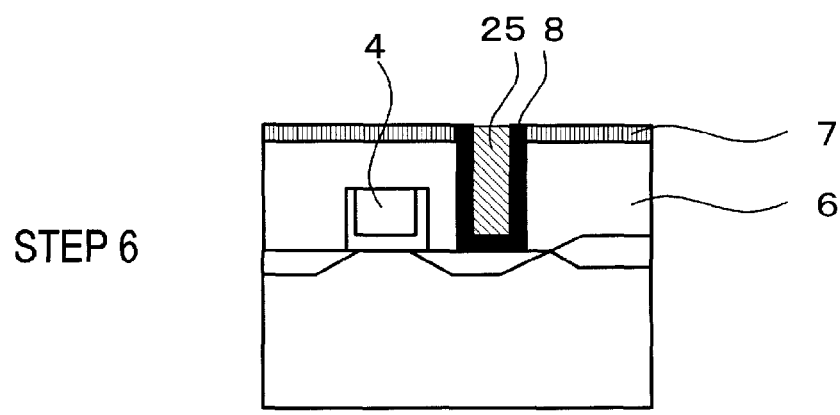
STEP 6

FIG.4
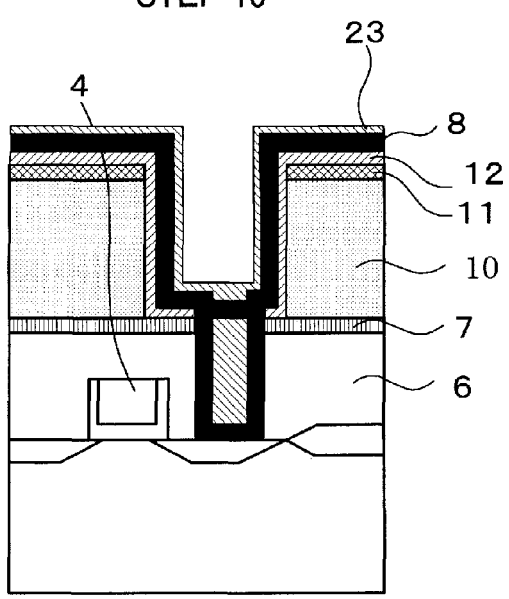
STEP 10
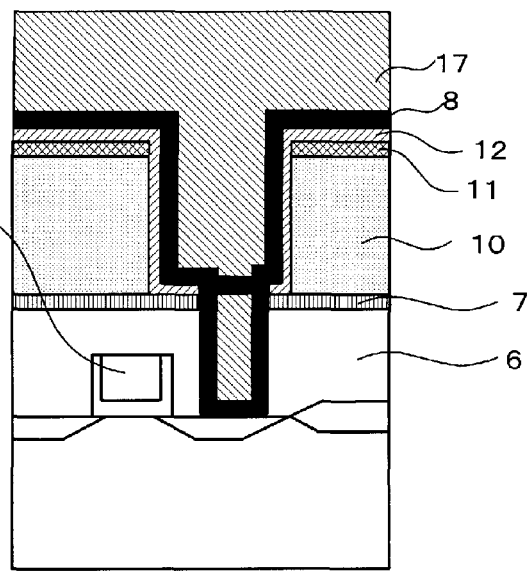
STEP 11
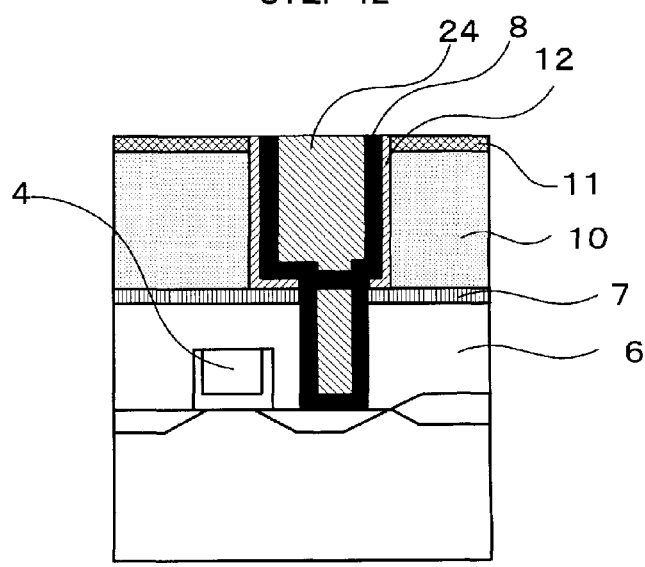
STEP 12

STEP 13

STEP 14

STEP 15

STEP 16

STEP 17

INTERFACIAL ROUGHNESS REDUCING FILM, WIRING LAYER, SEMICONDUCTOR DEVICE, AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2007-250725, filed on Sep. 27, 2007 the entire contents of which are incorporated herein by reference.

FIELD

The following embodiments relate to technology for reducing interfacial roughness at interfaces between the insulating films and the wirings in a semiconductor device.

BACKGROUND

Although power consumption is known to increase due to leakage currents within insulating films for wiring layers, the impact of leakage on the device as a whole has been small in those generations of semiconductor devices where the spacing between adjacent wirings was more than 1 μm. However, at line spacings of 1 micron or less, the impact on power consumption is larger due to the narrower line spacings and the increase in the scale of the circuitry. In particular, as the semiconductor industry moves toward the production of circuitry at line spacings of 0.1 μm or less, leakage currents between wirings will have a large impact on the characteristics and life of the semiconductor device.

One method currently used to form the wiring in semiconductor devices is the damascene method which involves first etching an insulating film so as to form therein trenches in the shape of the wiring lines, then plating the trenches to form copper lines. However, in this damascene method, the etching inevitably incurs damage on the insulating film, resulting in increased leakage or a deterioration in the time-dependent dielectric breakdown (TDDB) properties, etc. owing to the roughness of the wiring trenches, which significantly lowers product yield and reliability during semiconductor manufacture.

In light of these circumstances, there is a need to either minimize damage to the insulating film when etching is carried out at the time of wiring trench formation or to carry out surface treatment so as to reduce leakage after etching has been carried out.

Surface treatments that are currently carried out to minimize etching damage include hydrophobization of the wiring trenches after etching, as disclosed in the respective claims of, for example, Japanese Patent Application Laid-open No. H6-267946, Japanese Patent Application (Published Japanese Translation of PCT International Publication) Nos. 2004-511896 and 2004-513503, Japanese Patent Application Laid-open No. 2004-292304 and Japanese Patent Application (Published Japanese Translation of PCT International Publication) No. 2007-508691.

However, with a method like that mentioned above, the requisite device characteristics are not obtained when reliability tests such as a TDDB test are carried out. It thus became apparent that increasing the reliability will require further improvements.

SUMMARY

It is therefore an object to provide technology which eliminates the impact of damage to the insulating film at the stage where etching is carried out for wiring trench formation. Other objects, features will become apparent from the following detailed description.

According to a first aspect of the embodiments described in this specification, there is provided an interfacial roughness reducing film in contact, on one side thereof, with an insulating film and in contact, on a side opposite from the one side, with wiring, the interfacial roughness reducing film containing a Si—O bond, and being formed using a composition comprising a silicon compound that contains at least one bond of Si—N bonds and Si—Cl bonds wherein the number of Si—N bonds and Si—Cl bonds combined per molecule of the compound is at least two, wherein an interfacial roughness between the interfacial roughness reducing film and the wiring is smaller than that between the interfacial roughness reducing film and the insulating film.

This aspect enables the manufacture of wiring layers and semiconductor devices having a low power consumption and a high reliability.

According to another aspect of the embodiments, there is provided a method of manufacturing a semiconductor device having therein the above-described interfacial roughness reducing film, the method including treating an insulating film on a semiconductor device with the composition at a temperature of from 50 to 200° C.

This aspect enables the manufacture of semiconductor devices having a low power consumption and a high reliability.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIG. 1 shows schematic cross-sectional views related to a method of manufacturing an exemplary multilevel metallization structure according to the embodiments described in this specification;

FIG. 2 shows schematic cross-sectional views related the same method of manufacturing an exemplary multilevel metallization structure according to the embodiments described in this specification;

FIG. 4 shows schematic cross-sectional views related to the same method of manufacturing an exemplary multilevel metallization structure according to the embodiments described in this specification;

DESCRIPTION OF EMBODIMENTS

Figure 3:
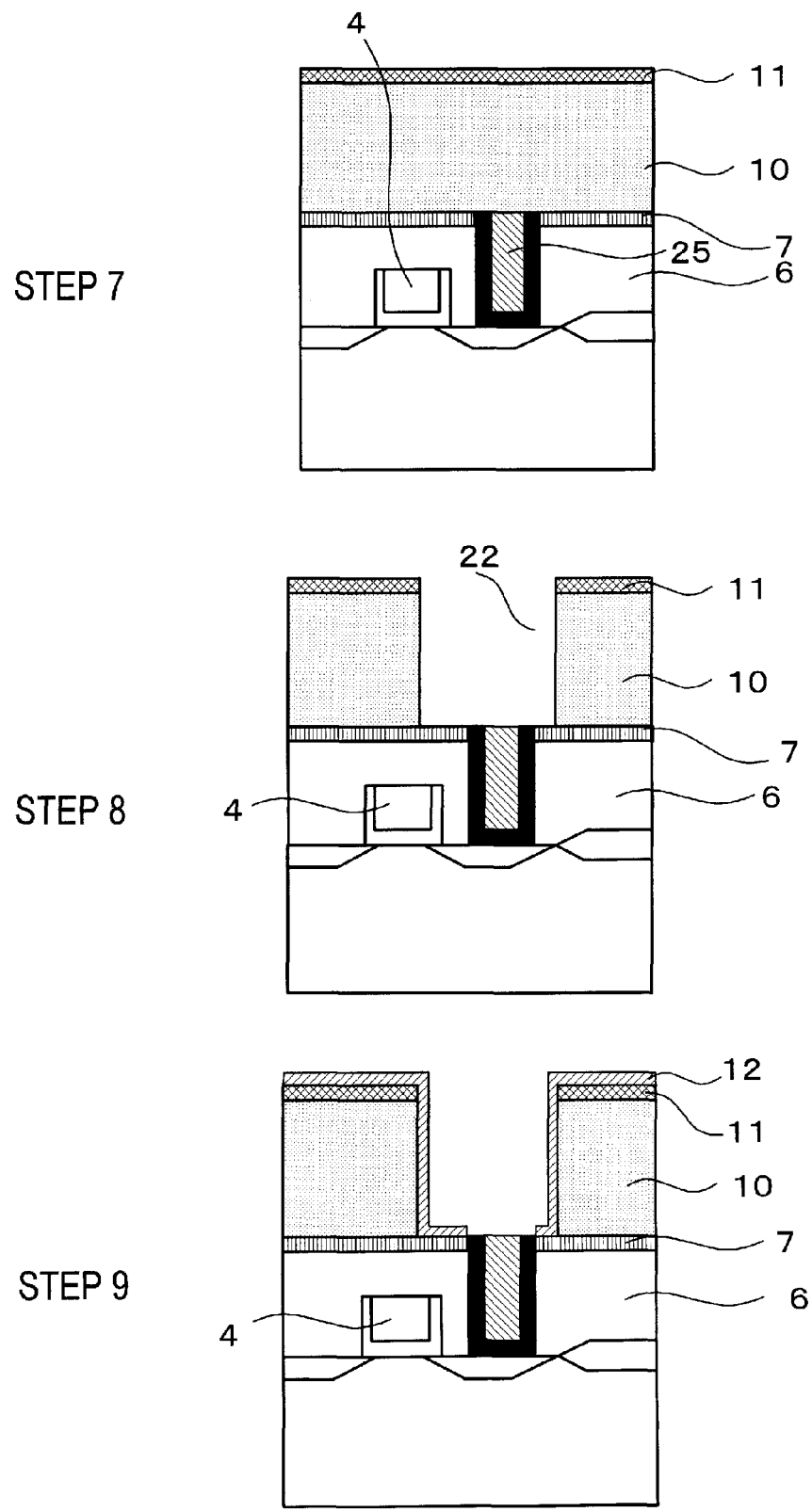
FIG. 3 shows schematic cross-sectional views related to the same method of manufacturing an exemplary multilevel metallization structure according to the embodiments described in this specification.
Figure 5:
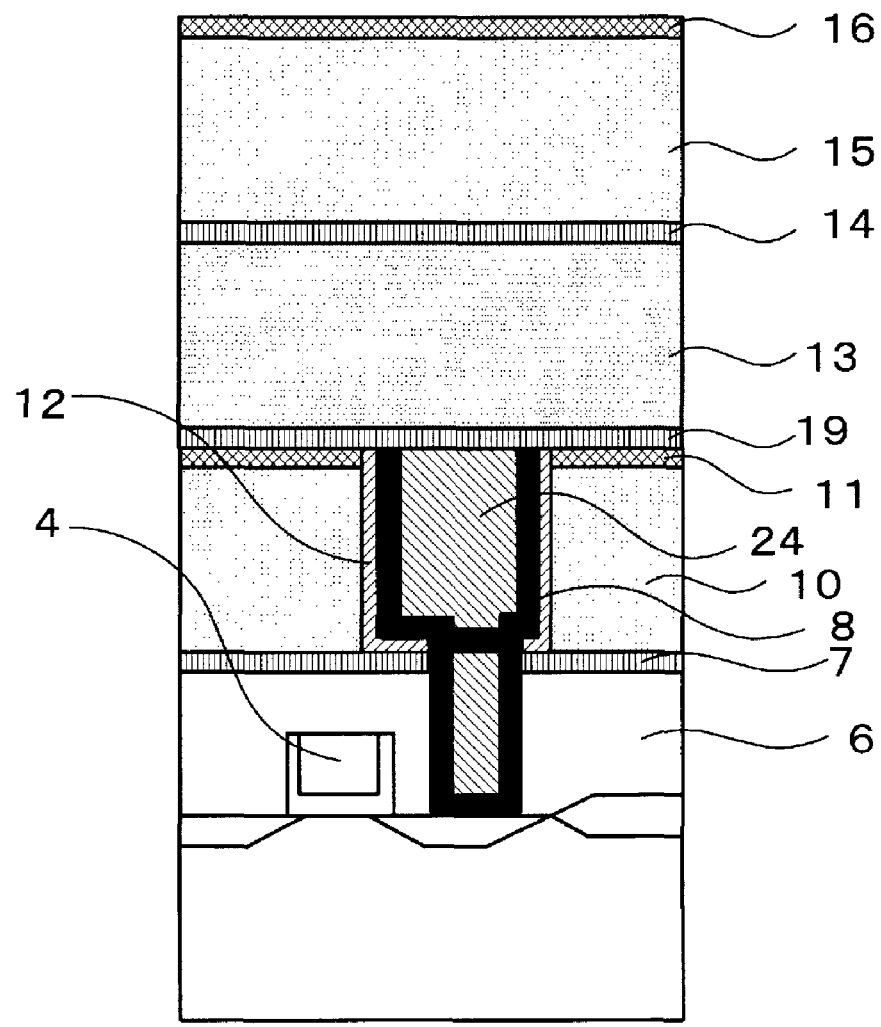
FIG. 5 is a schematic cross-sectional view related to the same method of manufacturing an exemplary multilevel metallization structure according to the embodiments described in this specification.
Figure 6:
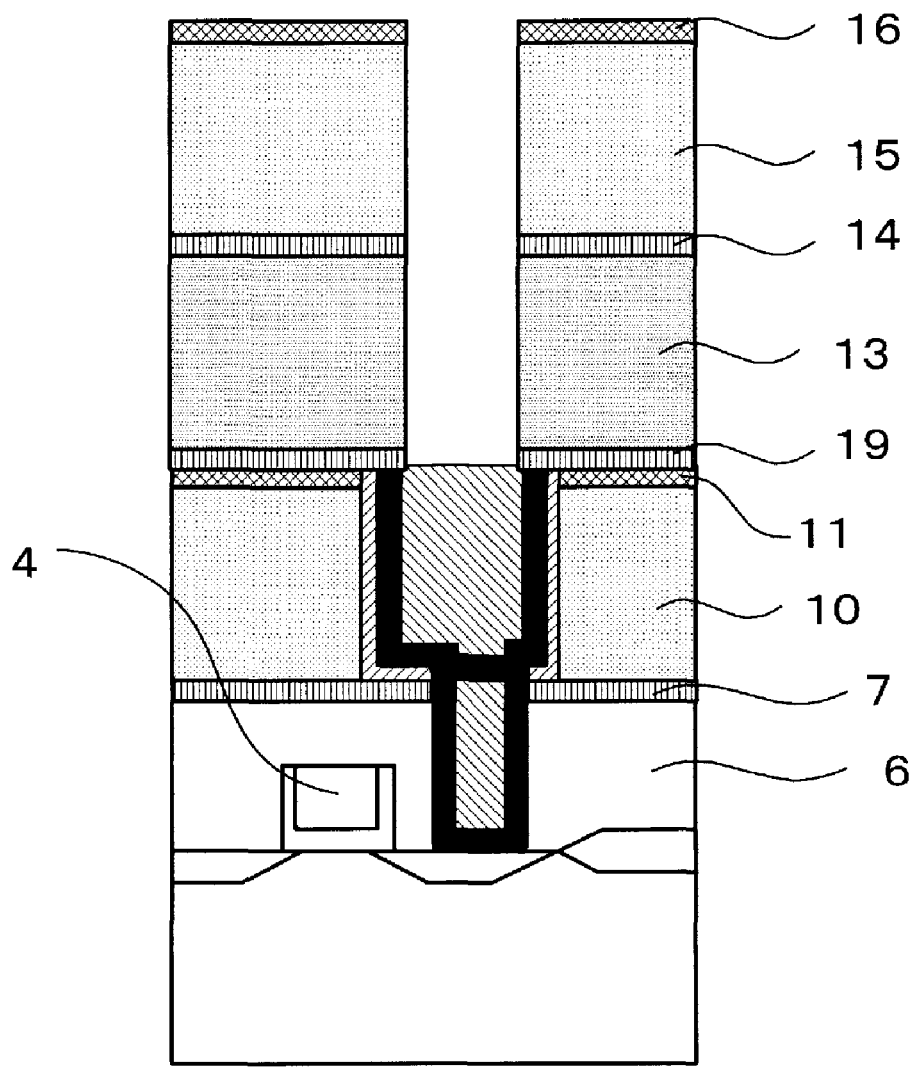
FIG. 6 is a schematic cross-sectional view related to the same method of manufacturing an exemplary multilevel metallization structure according to the embodiments described in this specification.
Figure 7:
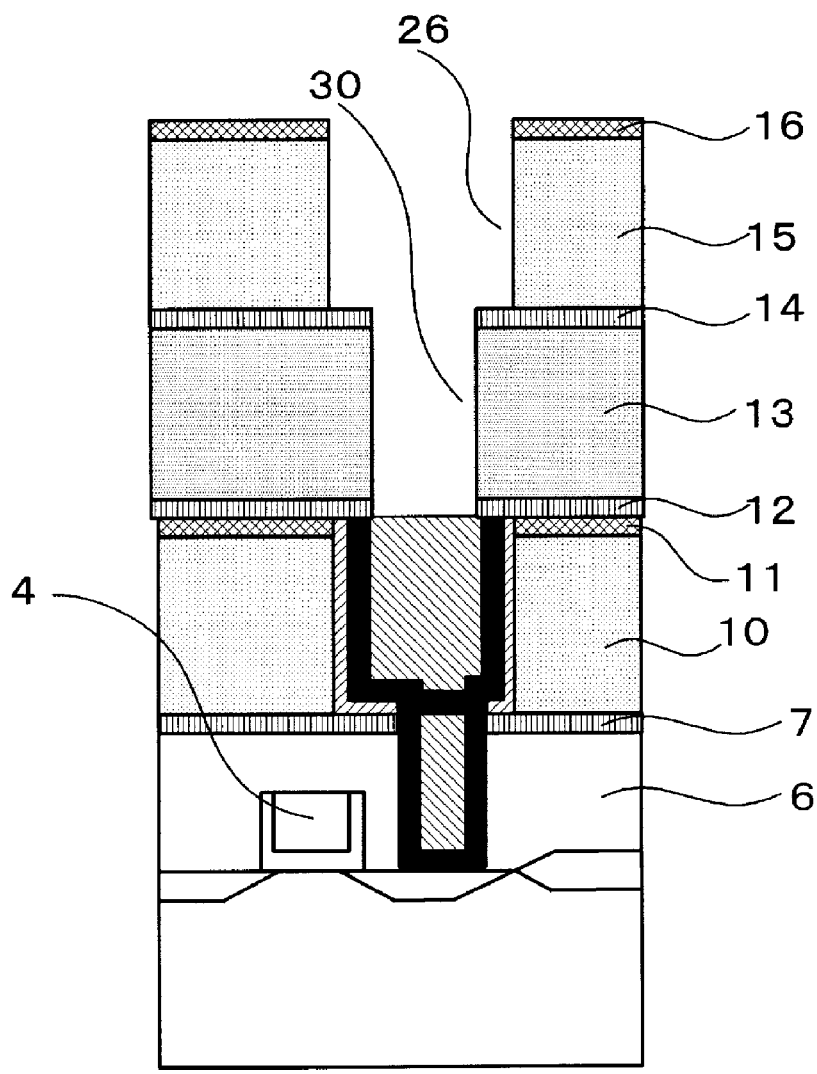
FIG. 7 is a schematic cross-sectional view related to the same method of manufacturing an exemplary multilevel metallization structure according to the embodiments described in this specification.
Figure 8:
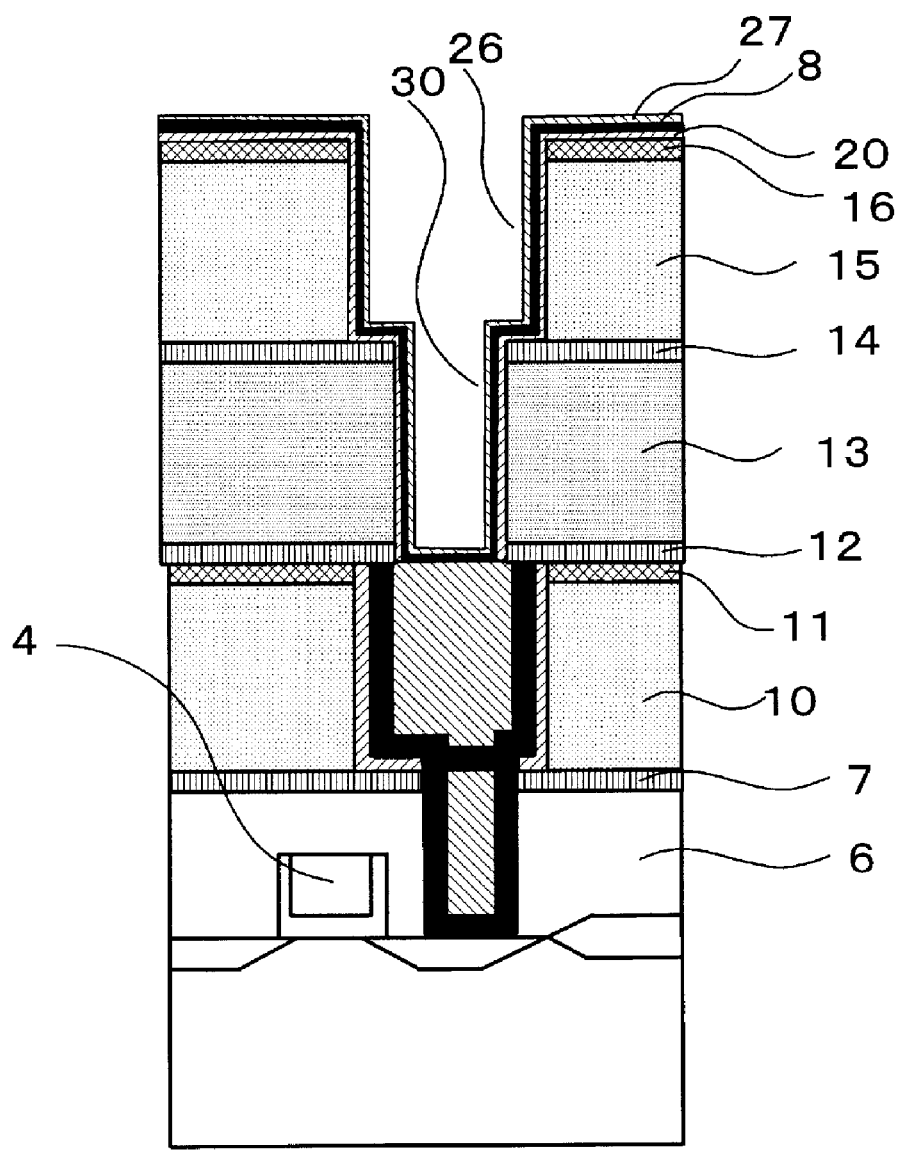
FIG. 8 is a schematic cross-sectional view related to the same method of manufacturing an exemplary multilevel metallization structure according to the embodiments described in this specification.
Figure 9:
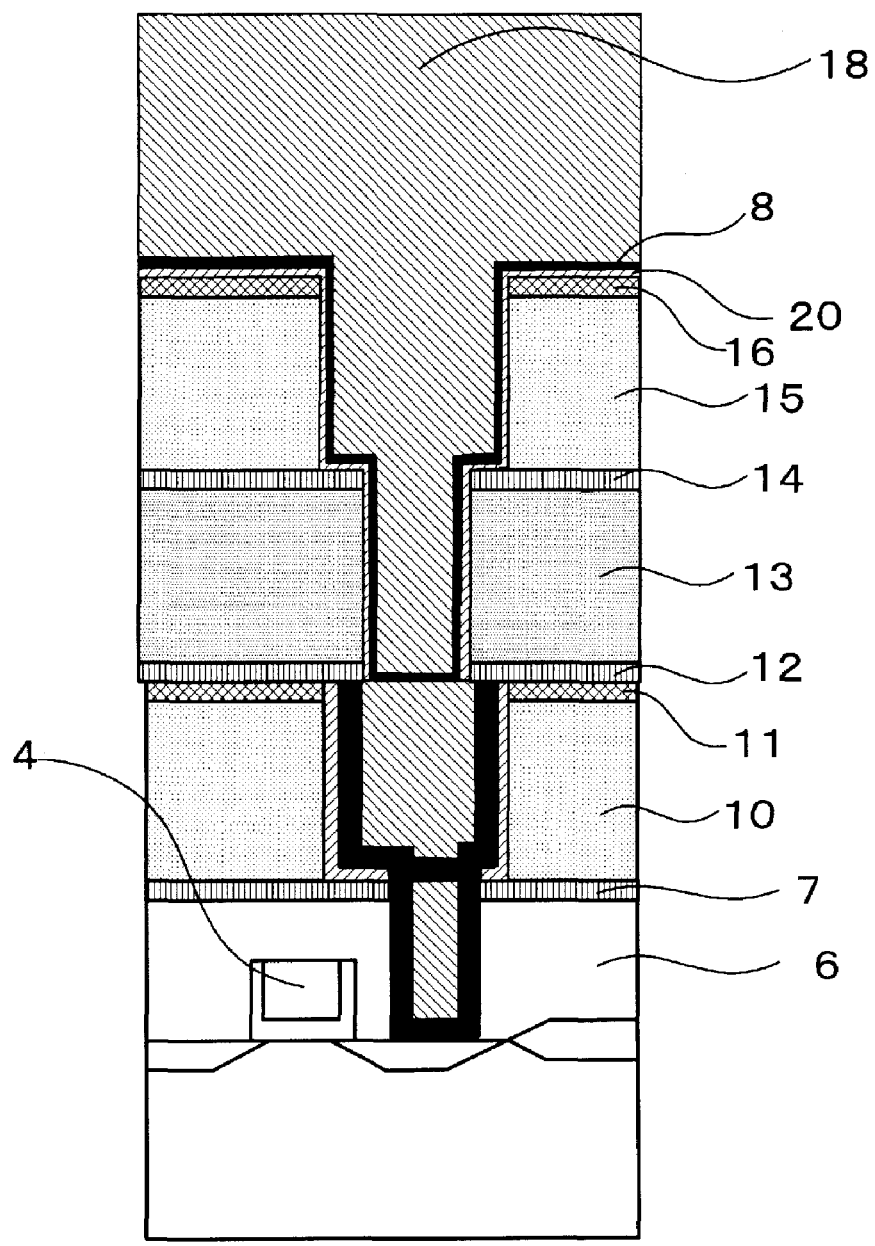
FIG. 9 is a schematic cross-sectional view related to the same method of manufacturing an exemplary multilevel metallization structure according to the embodiments described in this specification.
Figure 10:
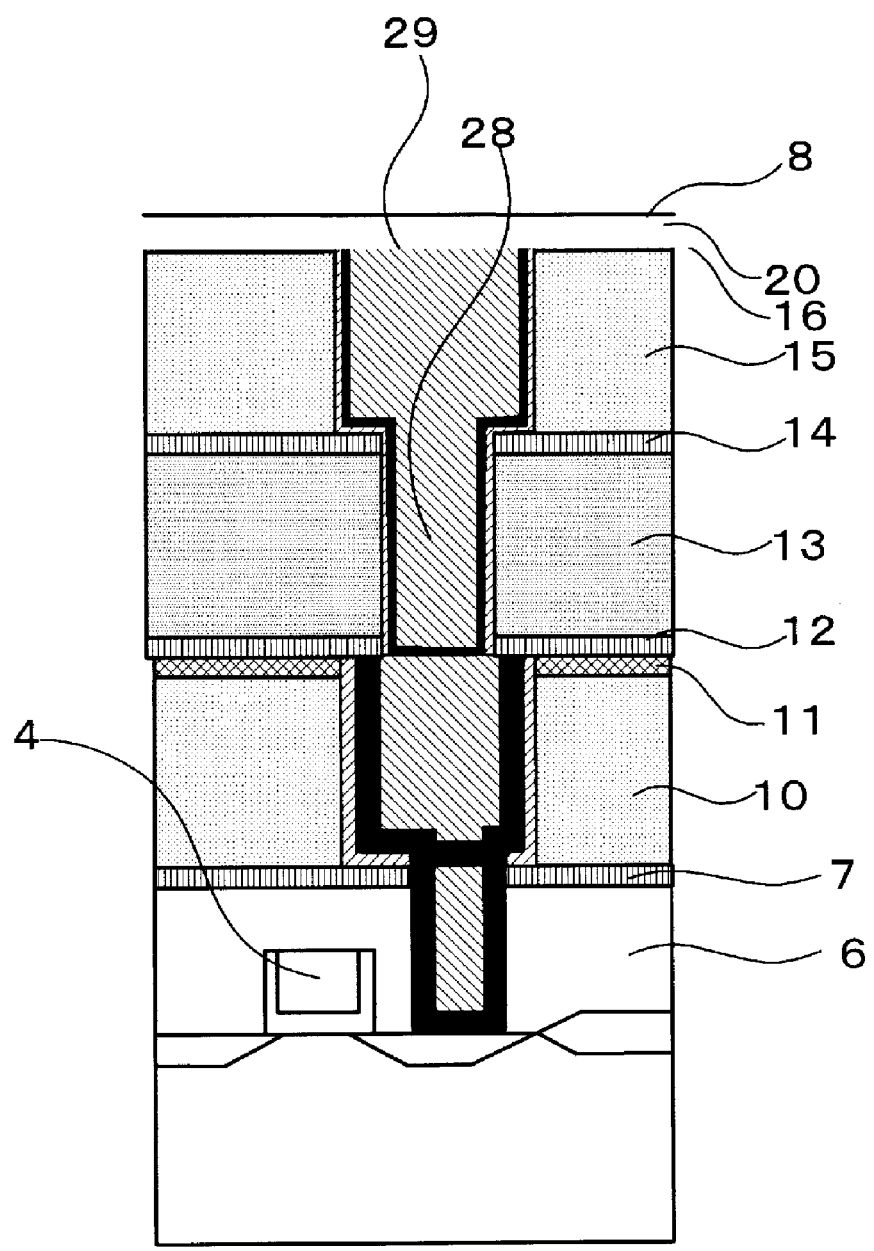
FIG. 10 is a schematic cross-sectional view related to the same method of manufacturing an exemplary multilevel metallization structure according to the embodiments described in this specification.

Embodiments are described below in conjunction with the accompanying diagrams, tables and examples. These diagrams, tables and examples are provided to illustrate the present invention, and are not intended to limit the scope of the invention. It is to be understood that, to the extent that they accord with the gist of the invention, other embodiments may also reside within the scope of the present invention. In the diagrams, like reference symbols denote like elements.

In this specification, an "interfacial roughness reducing film" refers to a film that is in a state of contact with a given layer, which film has a surface (or interface) on a side thereof not in contact with the given layer is smoother (i.e., less rough) than the film surface (i.e., interface) in contact with the given layer.

According to one aspect, there is provided an interfacial roughness reducing film in contact on one side thereof with an insulating film and in contact on an opposite side thereof with wiring. In this interfacial roughness reducing film, the interfacial roughness between the insulating film and the interfacial roughness reducing film is higher than the interfacial roughness between the wiring in contact with the opposite face thereof and the interfacial roughness reducing film. The presence of such an interfacial roughness reducing film is able to enhance the reliability of a wiring layer containing such wiring. The roughness may be measured by any known method. Advantageous use can be made of the arithmetic mean roughness Ra obtained from a surface image captured with an atomic force microscope (AFM).

In this specification, the reference to "an interfacial roughness reducing film in contact on one side thereof with an insulating film and in contact on an opposite side thereof with wiring" encompasses any spatial arrangement, provided the layer structure is arranged in the following order: insulating film/interfacial roughness reducing film/wiring. For example, when the interfacial roughness reducing film is provided within a semiconductor device, the planar direction of the interfacial roughness reducing film may be parallel, perpendicular, or oriented in some other direction with respect to the surface of the semiconductor device substrate.

In cases where another layer is interposed between a particular insulating film and the interfacial roughness reducing film, if the interposed layer is functionally capable of working as an insulating film, it may be regarded as an insulating film in accordance with the embodiments described in this specification. Similarly, in cases where another layer is interposed between a particular wiring line and the interfacial roughness reducing film, if the interposed layer functionally has electrical conductivity and is capable of working as wiring, it may be regarded as wiring in accordance with the embodiments described in this specification. Therefore, in cases where an electrically conductive barrier metal layer is present between an interfacial roughness reducing film and wiring, this barrier metal layer may be regarded as a part of the wiring.

The advantageous effects of interposing an interfacial roughness reducing film can be regarded as having been achieved if desirable effects such as a reduction in the leakage current and a higher TDDB resistance are achieved by satisfying the above-described arrangement.

Figure 11:
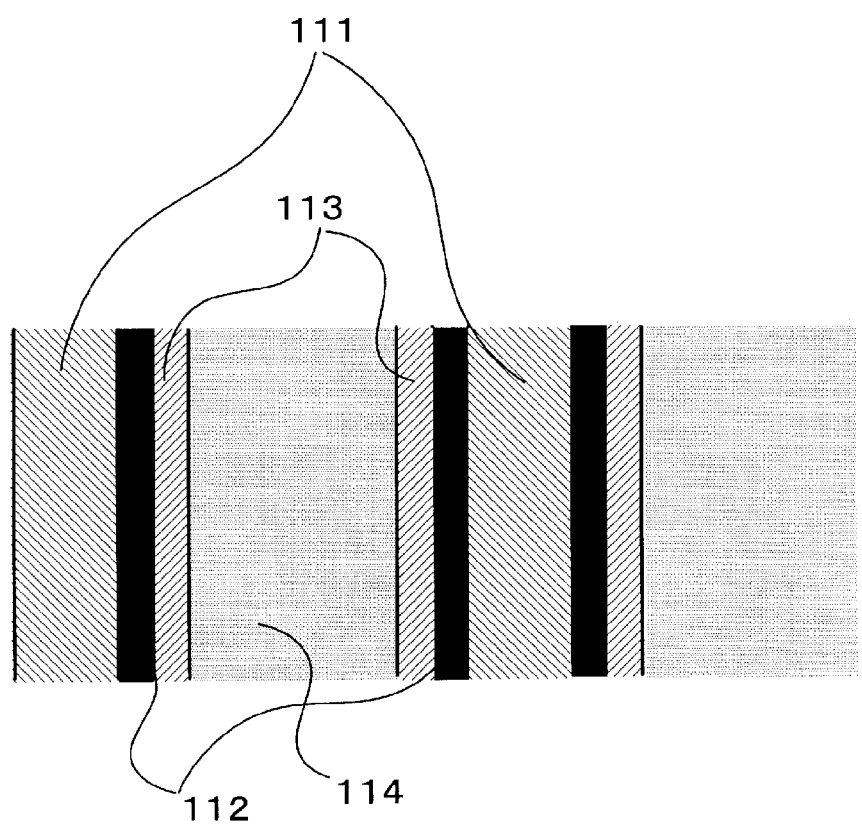
FIG. 11 is a schematic plan view of an insulating film/interfacial roughness reducing film/wiring structure.
Figure 12:
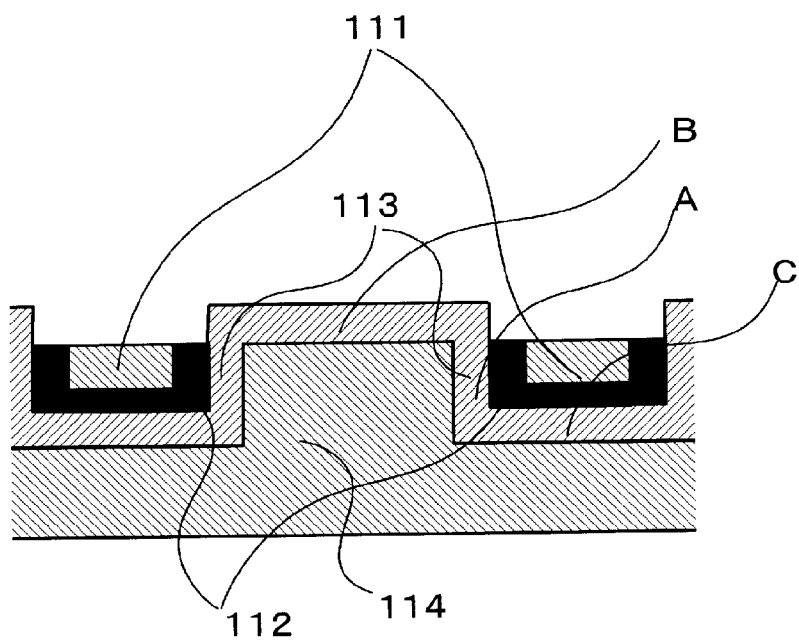
FIG. 12 is a schematic cross-sectional view of the same insulating film/interfacial roughness reducing film/wiring structure.

The insulating film/interfacial roughness reducing film/wiring structure is exemplified by the construction shown in FIGS. 11 and 12. FIG. 11 is a plan view of an insulating film/interfacial roughness reducing film/wiring structure, and FIG. 12 is a cross-sectional view of the same structure (the interfacial roughness reducing film on the insulating film is not shown in FIG. 11). In FIGS. 11 and 12, wiring lines 111 have, on either side and below thereof, a barrier metal layer 112. The barrier metal layer 112 has, on the side opposite to the side facing the wiring lines 111, an interfacial roughness reducing film 113 according to the embodiments described in this specification. The interfacial roughness reducing film 113 has in turn, on the side opposite to the side facing the barrier metal layer 112, an insulating film 114 having a rough face thereon. In FIG. 12, the wiring layer 111 is buried in the insulating film 114, and the interfacial roughness reducing film 113 has been formed at positions A, B and C in the diagram.

Positions A, B and C are examples where the interfacial roughness reducing film is in contact with wiring on a side thereof opposite to the side in contact with the insulating film (at position B, this condition is satisfied when wiring is provided thereon). This example shows a state where an interfacial roughness reducing film is not formed over the wiring layer 111 or the barrier metal layer 112.

The reason why the desirable effects can be achieved in the examples of positions A, B and C is presumed to be as follows. Because the surface of the interfacial roughness reducing film in contact with the wiring is flatter than the surface of the insulating film when the insulating film and the wiring are in contact (this corresponds to the interfacial roughness between the insulating film and the interfacial roughness reducing film), problems such as an increase in the amount of leakage due to electrical field concentration caused by damage such as a rough surface or fine cracks in the insulating film and deterioration in TDDB properties due to wiring trench roughness can be prevented. In this way, the amount of leakage current from the wiring decreases, enabling a wiring layer (e.g., LSI wiring layer) having a high TDDB resistance to be obtained. As a result, semiconductor devices having a low power consumption and a high reliability can be manufactured. Here, a "wiring layer" refers to a layer which includes a wiring structure and, as shown in FIGS. 11 and 12, can be exemplified by layers containing elements other than wiring lines within the same plane (e.g., insulating films, interfacial roughness reducing films, barrier metal layers).

The insulating film in the embodiments described in this specification refers to a film used for the purpose of insulating between conductors, regardless of whether it is specifically called an "insulating film." Specific examples include interlayer insulating films, wiring isolation insulating films and protective films (e.g., stopper films for setting the CMP endpoint) for such dielectrics used in semiconductor devices. The thickness and place of use for such insulating films are not subject to any particular limitation.

The material used in the insulating film in the embodiments described in this specification is not subject to any particular limitation, and may be suitably selected from known materials. However, because the embodiments described in this specification are particularly well-suited to applications having a spacing between the wiring lines of 1 μm or less, it is preferable to form an insulating film having a low dielectric constant. More specifically, it is advantageous for the insulating film to have pores and to be a low-k insulating film having a specific dielectric constant of preferably 2.7 or less, and more preferably 2.5 or less. Generally, when the insulating film has a specific dielectric constant smaller than about 2.7, the dielectric properties and reliability thereof tend to suddenly decrease. The effects of the embodiments described in this specification are particularly useful under such circumstances.

An insulating film, and particularly a low-k insulating film having a dielectric constant of 2.5 or below, can be obtained by coating onto a substrate a liquid composition containing an organosilicon compound prepared by hydrolyzing, in the presence of a tetraalkylammonium hydroxide in use of one or more silane compound of the following formulas (16) to (19) and heat-treating the film of liquid composition coated onto the substrate at a temperature of at least 80° C. but not above 350° C.; then baking the heat-treated film at a temperature above 350° C. but not more than 450° C. It is therefore advantageous to use such an insulating film.

$$Si(OR^{111})_4 \quad (16)$$

$$X^1Si(OR^{112})_3 \quad (17)$$

$$X^2X^3Si(OR^{113})_2 \quad (18)$$

$$X^4X^5X^6SiOR^{114} \quad (19)$$

(In above formulas (16) to (19), $X^1$ to $X^6$ are each independently selected from the group consisting of hydrogen, fluorine, and alkyls, fluorinated alkyls, aryls and vinyls having 1 to 8 carbons. $R^{111}$ to $R^{114}$ are each independently selected from the group consisting of alkyls having 1 to 20 carbons, alkenyls, alkynyls, alkylcarbonyls, alkenylalkyls and alkynylalkyls having from 2 to 20 carbons, and aryls having from 6 to 20 carbons).

Low-k insulating films obtained in this way often have excellent mechanical strength, dielectric properties and reliability compared with other low-k insulating films having comparable dielectric constants, and thus are able to contribute to the formation of wiring layers (LSI wiring layers, etc.) endowed with higher dielectric properties and reliability.

Use can also be made of other insulating films, such as SiC films (which in most cases include some degree of oxygen, nitrogen, hydrogen, etc.), SiN films, and SiF films. These are commonly used in semiconductor devices, and show good potential for achieving the objects and advantages of the embodiments described in this specification.

Materials which may be used in the wiring are not subject to any particular limitation, and may be suitably selected from among known materials such as copper, aluminum, gold and platinum.

The interfacial roughness reducing film is preferably furnished subsequent to treatment accompanied by surface roughening of the insulating film. As used herein, "treatment accompanied by surface roughening" denotes any type of treatment in which surface roughening occurs. Specific examples include operations which gradually remove portions of the insulating film, such as etching. Chemical mechanical polishing (CMP), which is generally regarded as a surface-smoothening treatment, may also be thought of as belonging within the range of treatments accompanied by surface roughening, so long as the condition that the interfacial roughness reducing film have a smaller interfacial roughness with the wiring than with the insulating film is satisfied.

Because the insulating film following such treatment is rougher and damage such as fine cracks can arise, the amount of current leakage may increase and a deterioration in the TDDB characteristics may occur due to the wiring trench roughness. Problems of this sort can become major factors in lowering product yield and reliability in semiconductor manufacture. In such cases, by providing an interfacial roughness reducing film, the surface roughness of the interfacial roughness reducing film on the side not in contact with the insulating film is smaller than the interfacial roughness when an insulating film and wiring are direct contact, and damage such as the fine cracks that arise at the surface of the insulating film does not come into direct contact with the wiring. As a result, the amount of leakage current from the wiring decreases, enabling a LSI wiring layer having a high TDDB resistance to be obtained. This in turn makes it possible to manufacture semiconductor devices having a low power consumption and a high reliability.

The thickness of the interfacial roughness reducing film may be set to any value in keeping with actual conditions (mores specifically, based on the degree to which the surface roughness and fine damage to the insulating film can be reduced). Generally, it is preferable to set the average film thickness within a range of from 0.1 to 50 nm. At less than 0.1 nm, roughness reducing effects often cannot be achieved. On the other hand, at a thickness above 50 nm, significant improvement is generally unlikely. Moreover, there is a possibility that undesirable effects will occur, such as an increase in via resistance and a rise in the effective dielectric constant of the insulating layer due to filling of the via holes.

Because the interfacial roughness reducing film functions as part of the insulating film, it is preferable for it to have Si—O bonds. This enables the required dielectric properties (in particular, a low dielectric constant) to be readily achieved.

More specifically, it is preferable that the material used to form the interfacial roughness reducing film (i.e., the interfacial roughness reducing film-forming material) be a composition containing a silicon compound which satisfies the condition of having an average molecule weight of 300 or less and/or the condition of including up to five silicon atoms per molecule. Employing such a composition as the film-forming material enables film formation to be carried out using any easy process and without adversely affecting other processes. When the average molecular weight exceeds 300 and/or the number of silicon atoms included per molecule exceeds five, adverse effects on other processes (such as making vapor treatment impossible or increasing contact defects on copper lines) are significant.

Ingredients other than those mentioned above may also be included in this composition, provided such ingredients are in keeping with the spirit of the embodiments described in this specification. For example, a solvent for lowering the viscosity may be included.

By using this composition to furnish an interfacial roughness reducing film on the insulating film, the free surface of the resulting interfacial roughness reducing film can be rendered more planar than the interface with the insulating film. That is, by using this composition to form a layer on the surface of the insulating film, the roughness on the free surface of the layer thus formed will be smaller than the roughness of the interface thereof with the insulating film. Therefore, if wiring is formed in contact with this free surface, the interfacial roughness between the interfacial roughness reducing film and the wiring will be lower than the interfacial roughness between the interfacial roughness reducing film and the insulating film. Moreover, fine damage can be repaired. Hence, by forming, on this interfacial roughness reducing film, wiring elements in any of the arrangements A to C shown in FIGS. 11 and 12, it is possible to obtain "an interfacial roughness reducing film in contact on a first side thereof with an insulating film and in contact on a side opposite from the first side with wiring, wherein the interfacial roughness reducing film has a smaller interfacial roughness with the wiring than with the insulating film."

The interfacial roughness reducing film can be obtained by treating the insulating film with the interfacial roughness reducing film-forming material while the semiconductor device is in a heated state. As used herein, "treating" refers to bringing the interfacial roughness reducing film-forming material into contact with the insulating film by some means. The treatment used for this purpose is preferably vapor treatment. Following such treatment, wiring is formed in contact with this interfacial roughness reducing film. The heat treatment temperature is preferably from 50 to 200° C., and the treatment time is preferably from 0.1 to 20 minutes.

When wiring is exposed together with the insulating film and an interfacial roughness reducing film-forming material is coated so as to be in contact with the insulating film, there are cases in which the interfacial roughness reducing film-forming material comes into contact, in a vapor phase state, with the wiring. However, because the reactivity with the wiring is low, this in unlikely to be an impediment when the wiring layer is electrically connected with other conductors (e.g., vias), and there is little risk of a rise in the wiring resistance and the via contact resistance.

The reason is as follows. When the interfacial roughness reducing film-forming material is deposited on the insulating film surface that has been treated by etching or CMP, if a silicon-containing compound is used as the insulating film, the interfacial roughness reducing film-forming material is able to react with the silanol groups that arise at the surface of the insulating film, enabling a strong interfacial roughness reducing film to form. In addition, even when copper wiring or the like is present, reactions of the interfacial roughness reducing film-forming material with copper and other wiring materials do not arise during treatment, enabling easy removal of the film-forming material thereafter. It is thus possible to selectively form an interfacial roughness reducing film on the insulating film.

"Vapor treatment" refers to the introduction of a gaseous material (e.g., an interfacial roughness reducing film-forming material) in the state of a vapor onto the insulating film. Any suitably known method may be employed for this purpose, such as a method that involves, if necessary, placing the system under a vacuum, and entraining the material vapor with a carrier gas, etc.

Vapor treatment with the interfacial roughness reducing film-forming material or with the subsequently described compound having exactly one Si—N bond or Si—Cl bond per molecule is preferably carried out in an oxygen-free atmosphere, such as a nitrogen atmosphere. This oxygen-free atmosphere is more preferably continued for a suitable period of time after coating and up until the completion of heat treatment. The purpose here is to prevent a rise in the dielectric constant of the interfacial roughness reducing film due to the presence of oxygen. The degree to which the presence of oxygen is excluded may be suitably decided in accordance with actual circumstances.

The silicon compound included in the above-mentioned interfacial roughness reducing layer-forming material is a compound which has at least one bond of Si—N bonds and Si—Cl bonds, and in which the number of Si—N bonds and Si—Cl bonds combined per molecule of the compound is at least two. In this case, nitrogen and chlorine may bond to the same silicon or may bond to separate silicon atoms. When nitrogen and chlorine bond to separate silicon atoms, these "separate silicon atoms" generally bond together through other atoms such as carbon.

These bonds are thought to easily cleave and change to Si—O bonds during production of the interfacial roughness reducing film and in subsequent treatment such as hot-plate heating, heating in a furnace, IR irradiation, UV irradiation, x-ray irradiation, gamma ray irradiation, electron beam irradiation, alpha ray irradiation, and plasma exposure. At this time, Si—N bonds and Si—Cl bonds can easily be replaced with Si—O bonds. When the number of Si—N bonds and Si—Cl bonds combined per molecule is two, O—Si—O bonds form, thus enabling SiO repeating units to extend linearly. When the total number of such bonds in a molecule is three or more, bridging is also possible. This enables the formation of a strong layer and also enables the easy formation of strong bonds to the adjoining insulating layer. There are cases in which it may be sometimes acceptable for Si—N bonds and Si—Cl bonds to remain in the interfacial roughness reducing layer, although because these bonds often increase the dielectric constant owing to moisture absorption and the like, it is generally preferable for the ratio of such residual bonds to be low. Specifically, it is preferable for the nitrogen content and the chlorine content of the interfacial roughness reducing layer to both be, respectively, 500 ppm by weight or less. At higher respective contents, the dielectric constant tends to increase.

The silicon compound preferably includes at least one moiety thereof per molecule, represented by at least one of formulas (1) to (3) below.

N—Si—N (1)

N—Si—Cl (2)

Cl—Si—Cl (3)

Illustrative, non-limiting examples of the atoms to which the silicon atom is coupled via each silicon valence bond not shown in formulas (1) to (3) include carbon and oxygen. Other possibilities include nitrogen and chlorine.

The silicon compound is more specifically exemplified by compounds which include at least one moiety thereof per molecule represented by at least one of formulas (4) to (15) below:

-continued

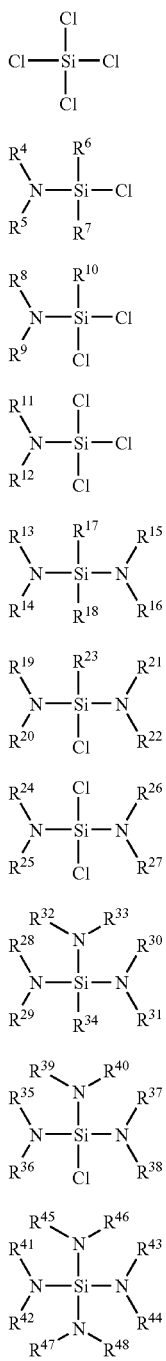

Each of $R^1$ to $R^{48}$ in formulas (4) to (15) is, independently in and among the respective formulas, selected from the group consisting of alkyls having from 1 to 20 carbons, alkenyls, alkynyls, alkylcarbonyls, alkenylalkyls and alkynylalkyls having from 2 to 20 carbons, and aryls having from 6 to 20 carbons. It is especially preferable for each of $R^1$ to $R^{48}$ in formulas (4) to (15) to be, independently in and among the respective formulas, selected from the group consisting of alkyls having from 1 to 3 carbons, alkenyls, alkynyls, alkylcarbonyls having from 2 to 4 carbons, alkenylalkyls and alkynylalkyls having from 3 to 6 carbons, and aryls having from 6 to 10 carbons.

Examples of such compounds include, but are not limited to, the following compounds: bis(dimethylamino)dimethylsilane, bis(dimethylamino)diethylsilane, bis(dimethylamino)dipropylsilane, bis(dimethylamino)diisopropylsilane, bis(dimethylamino)divinylsilane, bis(dimethylamino)diphenylsilane, bis(dimethylamino)di(n-butyl)silane, bis(dimethylamino)di(s-butyl)silane, bis(dimethylamino)di(t-butyl)silane, bis(dimethylamino)ethylmethylsilane, bis(dimethylamino)methylpropylsilane, bis(dimethylamino)ethylpropylsilane, bis(dimethylamino)methylisopropylsilane, bis(dimethylamino)ethylisopropylsilane, bis(dimethylamino)isopropylpropylsilane, bis(dimethylamino)methylvinylsilane, bis(dimethylamino)ethylvinylsilane, bis(dimethylamino)propylvinylsilane, bis(dimethylamino)isopropylvinylsilane, bis(dimethylamino)methylphenylsilane, bis(dimethylamino)ethylphenylsilane, bis(dimethylamino)phenylpropylsilane, bis(dimethylamino)isopropylphenylsilane, bis(dimethylamino)phenylvinylsilane, bis(dimethylamino)-n-butylmethylsilane, bis(dimethylamino)-n-butylethylsilane, bis(dimethylamino)-n-butylpropylsilane, bis(dimethylamino)-n-butylsilpropylsilane, bis(dimethylamino)-n-butylvinylsilane, bis(dimethylamino)-n-butylphenylsilane, bis(dimethylamino)-s-butylmethylsilane, bis(dimethylamino)-s-butylethylsilane, bis(dimethylamino)-s-butylpropylsilane, bis(dimethylamino)-s-butylisopropylsilane, bis(dimethylamino)-s-butylvinylsilane, bis(dimethylamino)-s-butylphenylsilane, bis(dimethylamino)-n-butyl-s-butylsilane, bis(dimethylamino)-t-butylmethylsilane, bis(dimethylamino)-t-butylethylsilane, bis(dimethylamino)-t-butylpropylsilane, bis(dimethylamino)-t-butylisopropylsilane, bis(dimethylamino)-t-butylvinylsilane, bis(dimethylamino)-t-butylphenylsilane, bis(dimethylamino)-n-butyl-t-butylsilane, bis(dimethylamino)-s-butyl-t-butylsilane, bis(dimethylamino)methylsilane, bis(dimethylamino)ethylsilane, bis(dimethylamino)propylsilane, bis(dimethylamino)isopropylsilane, bis(dimethylamino)vinylsilane, bis(dimethylamino)phenylsilane, bis(dimethylamino)-n-butylsilane, bis(dimethylamino)-s-butylsilane, bis(dimethylamino)-t-butylsilane, bis(dimethylamino)silane, tris(dimethylamino)methylsilane, tris(dimethylamino)ethylsilane, tris(dimethylamino)propylsilane, tris(dimethylamino)isopropylsilane, tris(dimethylamino)vinylsilane, tris(dimethylamino)phenylsilane, tris(dimethylamino)-n-butylsilane, tris(dimethylamino)-s-butylsilane, tris(dimethylamino)-t-butylsilane, tris(dimethylamino)silane, bis(methylamino)dimethylsilane, bis(methylamino)diethylsilane, bis(methylamino)dipropylsilane, bis(methylamino)diisopropylsilane, bis(methylamino)divinylsilane, bis(methylamino)diphenylsilane, bis(methylamino)di(n-butyl)silane, bis(methylamino)di(s-butyl)silane, bis(methylamino)di(t-butyl)silane, bis(methylamino)ethylmethylsilane, bis(methylamino)methylpropylsilane, bis(methylamino)ethylpropylsilane, bis(methylamino)methylisopropylsilane, bis(methylamino)ethylisopropylsilane, bis(methylamino)isopropylpropylsilane, bis(methylamino)methylvinylsilane, bis(methylamino)ethylvinylsilane, bis(methylamino)propylvinylsilane, bis(methylamino)isopropylvinylsilane, bis(methylamino)methylphenylsilane, bis(methylamino)ethylphenylsilane, bis(methylamino)phenylpropylsilane, bis(methylamino)isopropylphenylsilane, bis(methylamino)phenylvinylsilane, bis(methylamino)-n-butylmethylsilane, bis(methylamino)-n-butylethylsilane, bis(methylamino)-n-butylpropylsilane, bis(methylamino)-n-butylisopropylsilane, bis(methylamino)-n-butylvinylsilane, bis(methylamino)-n-butylphenylsilane, bis(methylamino)-s-butylmethylsilane, bis(methylamino)-s-butylethylsilane, bis(methylamino)-s-butylpropylsilane, bis(methylamino)-s-butylisopropylsilane, bis(methylamino)-s-butylvinylsilane, bis(methylamino)-s-butylphenylsilane, bis(methylamino)-n-butyl-s-butylsilane, bis(methylamino)-t-butylmethylsilane, bis(methylamino)-t-butylethylsilane, bis(methylamino)-t-butylpropylsilane, bis(methylamino)-t-butylisopropylsilane, bis(methylamino)-t-butylvinylsilane, bis(methylamino)-t-butylphenylsilane, bis(methylamino)-n-butyl-t-butylsilane, bis(methylamino)-s-butyl-t-butylsilane, bis(methylamino)methylsilane, bis(methylamino)ethylsilane, bis(methylamino)propylsilane, bis(methylamino)isopropylsilane, bis(methylamino)vinylsilane, bis(methylamino)phenylsilane, bis(methylamino)-n-butylsilane, bis(methylamino)-s-butylsilane, bis(methylamino)-t-butylsilane, bis(methylamino)silane, tris(methylamino)methylsilane, tris(methylamino)ethylsilane, tris(methylamino)propylsilane, tris(methylamino)isopropylsilane, tris(methylamino)vinylsilane, tris(methylamino)phenylsilane, tris(methylamino)-n-butylsilane, tris(methylamino)-s-butylsilane, tris(methylamino)-t-butylsilane, tris(methylamino)silane, bis(diethylamino)dimethylsilane, bis(diethylamino)diethylsilane, bis(diethylamino)dipropylsilane, bis(diethylamino)diisopropylsilane, bis(diethylamino)divinylsilane, bis(diethylamino)diphenylsilane, bis(diethylamino)di(n-butyl)silane, bis(diethylamino)di(s-butyl)silane, bis(diethylamino)di(t-butyl)silane, bis(diethylamino)ethylmethylsilane, bis(diethylamino)methylpropylsilane, bis(diethylamino)ethylpropylsilane, bis(diethylamino)methylisopropylsilane, bis(diethylamino)ethylisopropylsilane, bis(diethylamino)isopropylpropylsilane, bis(diethylamino)methylvinylsilane, bis(diethylamino)ethylvinyl silane, bis(diethylamino)propylvinylsilane, bis(diethylamino)isopropylvinylsilane, bis(diethylamino)methylphenylsilane, bis(diethylamino)ethylphenylsilane, bis(diethylamino)phenylpropylsilane, bis(diethylamino)isopropylphenylsilane, bis(dimethylamino)phenylvinylsilane, bis(diethylamino)-n-butylmethylsilane, bis(diethylamino)-n-butylethylsilane, bis(diethylamino)-n-butylpropylsilane, bis(diethylamino)-n-butylisopropylsilane, bis(dimethylamino)-n-butylvinylsilane, bis(diethylamino)-n-butylphenylsilane, bis(diethylamino)-s-butylmethylsilane, bis(diethylamino)-s-butylethylsilane, bis(diethylamino)-s-butylpropylsilane, bis(diethylamino)-s-butylisopropylsilane, bis(diethylamino)-s-butylvinylsilane, bis(diethylamino)-s-butylphenylsilane, bis(diethylamino)-n-butyl-s-butylsilane, bis(diethylamino)-t-butylmethylsilane, bis(diethylamino)-t-butylethylsilane, bis(diethylamino)-t-butylpropylsilane, bis(diethylamino)-t-butylisopropylsilane, bis(diethylamino)-t-butylvinylsilane, bis(diethylamino)-t-butylphenylsilane, bis(diethylamino)-n-butyl-t-butylsilane, bis(diethylamino)-s-butyl-t-butylsilane, bis(diethylamino)methylsilane, bis(diethylamino)ethylsilane, bis(diethylamino)propylsilane, bis(diethylamino)isopropylsilane, bis(diethylamino)vinylsilane, bis(diethylamino)phenylsilane, bis(diethylamino)-n-butylsilane, bis(diethylamino)-s-butylsilane, bis(diethylamino)-t-butylsilane, bis(diethylamino)silane, tris(diethylamino)methylsilane, tris(diethylamino)ethylsilane, tris(diethylamino)propylsilane, tris(diethylamino)isopropylsilane, tris(diethylamino)vinylsilane, tris(diethylamino)phenylsilane, tris(diethylamino)-n-butylsilane, tris(diethylamino)-s-butylsilane, tris(diethylamino)-t-butylsilane, tris(diethylamino)silane, bis(ethylamino)dimethylsilane, bis(ethylamino)diethylsilane, bis(ethylamino)dipropylsilane, bis(ethylamino)diisopropylsilane, bis(ethylamino)divinylsilane, bis(ethylamino)diphenylsilane, bis(ethylamino)di(n-butyl)silane, bis(ethylamino)di(s-butyl)silane, bis(ethylamino)di(t-butyl)silane, bis(ethylamino)ethylmethylsilane, bis(ethylamino)methylpropylsilane, bis(ethylamino)ethylpropylsilane, bis(ethylamino)methylisopropylsilane, bis(ethylamino)ethylisopropylsilane, bis(ethylamino)isopropylpropylsilane, bis(ethylamino)methylvinylsilane, bis(ethylamino)ethylvinylsilane, bis(ethylamino)propylvinylsilane, bis(ethylamino)isopropylvinylsilane, bis(ethylamino)methylphenylsilane, bis(ethylamino)ethylphenylsilane, bis(ethylamino)phenylpropylsilane, bis(ethylamino)isopropylphenylsilane, bis(ethylamino)phenylvinylsilane, bis(ethylamino)-n-butylmethylsilane, bis(ethylamino)-n-butylethylsilane, bis(ethylamino)-n-butylpropylsilane, bis(ethylamino)-n-butylisopropylsilane, bis(ethylamino)-n-butylvinylsilane, bis(ethylamino)-n-butylphenylsilane, bis(ethylamino)-s-butylmethylsilane, bis(ethylamino)-s-butylethylsilane, bis(ethylamino)-s-butylpropylsilane, bis(ethylamino)-s-butylisopropylsilane, bis(ethylamino)-s-butylvinylsilane, bis(ethylamino)-s-butylphenylsilane, bis(ethylamino)-n-butyl-s-butylsilane, bis(ethylamino)-t-butylmethylsilane, bis(ethylamino)-t-butylethylsilane, bis(ethylamino)-t-butylpropylsilane, bis(ethylamino)-t-butylisopropylsilane, bis(ethylamino)-t-butylvinylsilane, bis(ethylamino)-t-butylphenylsilane, bis(ethylamino)-n-butyl-t-butylsilane, bis(ethylamino)-s-butyl-t-butylsilane, bis(ethylamino)methylsilane, bis(ethylamino)ethylsilane, bis(ethylamino)propylsilane, bis(ethylamino)isopropylsilane, bis(ethylamino)vinylsilane, bis(ethylamino)phenylsilane, bis(ethylamino)-n-butylsilane, bis(ethylamino)-s-butylsilane, bis(ethylamino)-t-butylsilane, bis(ethylamino)silane, tris(ethylamino)methylsilane, tris(ethylamino)ethylsilane, tris(ethylamino)propylsilane, tris(ethylamino)isopropylsilane, tris(ethylamino)vinylsilane, tris(ethylamino)phenylsilane, tris(ethylamino)-n-butylsilane, tris(ethylamino)-s-butylsilane, tris(ethylamino)-t-butylsilane, tris(ethylamino)silane, ethylaminomethylaminodimethylsilane, ethylaminomethylaminodiethylsilane, ethylaminomethylaminodipropylsilane, ethylaminomethylaminodiisopropylsilane, ethylaminomethylaminodivinylsilane, ethylaminomethylaminodiphenylsilane, ethylaminomethylaminodi(n-butyl)silane, ethylaminomethylaminodi(s-butyl)silane, ethylaminomethylaminodi(t-butyl)silane, ethylaminomethylaminoethylmethylsilane, ethylaminomethylaminomethylpropylsilane, ethylaminomethylaminoethylpropylsilane, ethylaminomethylaminomethylisopropylsilane, ethylaminomethylaminoethylisopropylsilane, ethylaminomethylaminoisopropylpropylsilane, ethylaminomethylaminomethylvinylsilane, ethylaminomethylaminoethylvinylsilane, ethylaminomethylaminopropylvinylsilane, ethylaminomethylaminoisopropylvinylsilane, ethylaminomethylaminomethylphenylsilane, ethylaminomethylaminoethylphenylsilane, ethylaminomethylaminophenylpropylsilane, ethylaminomethylaminoisopropylphenylsilane, ethylaminomethylaminophenylvinylsilane, ethylaminomethylamino-n-butylmethylsilane, ethylaminomethylamino-n-butylethylsilane, ethylaminomethylamino-n-butylpropylsilane, ethylaminomethylamino-n-butylisopropylsilane, ethylaminomethylamino-n-butylvinylsilane, ethylaminomethylamino-n-butylphenylsilane, ethylaminomethylamino-s-butylmethylsilane, ethylaminomethylamino-s-butylethylsilane, ethylaminomethylamino-s-butylpropylsilane, ethylaminomethylamino-s-butylisopropylsilane, ethylaminomethylamino-s-butylvinylsilane, ethylaminomethylamino-s-butylphenylsilane, ethylaminomethylamino-n-butyl-s- butylsilane, ethylaminomethylamino-t-butylmethylsilane, ethylaminomethylamino-t-butylethylsilane, ethylaminomethylamino-t-butylpropylsilane, ethylaminomethylamino-t-butylpropylsilane, ethylaminomethylamino-t-butylvinylsilane, ethylaminomethylamino-t-butylphenylsilane, ethylaminomethylamino-n-butyl-t-butylsilane, ethylaminomethylamino-s-butyl-t-butylsilane, ethylaminomethylaminomethylsilane, ethylaminomethylaminoethylsilane, etylaminomethylaminopropylsilane, ethylaminomethylaminoisopropylsilane, ethylaminomethylaminovinylsilane, ethylaminomethylaminophenylsilane, ethylaminomethylamino-n-butylsilane, ethylaminomethylamino-s-butylsilane, ethylaminomethylamino-t-butylsilane, ethylaminomethylaminosilane, diethylaminomethylaminodimethylsilane, diethylaminomethylaminodiethylsilane, diethylaminomethylaminodipropylsilane, diethylaminomethylaminodiisopropylsilane, diethylaminomethylaminodivinylsilane, diethylaminomethylaminodiphenylsilane, diethylaminomethylaminodi(n-butyl)silane, diethylaminomethylaminodi(s-butyl)silane, diethylaminomethylaminodi(t-butyl)silane, diethylaminomethylaminoethylmethylsilane, diethylaminomethylaminomethylpropylsilane, diethylaminomethylaminoethylpropylsilane, diethylaminomethylaminomethylisopropylsilane, diethylaminomethylaminoethylisopropylsilane, diethylaminomethylaminoisopropylpropylsilane, diethylaminomethylaminomethylvinylsilane, diethylaminomethylaminoethylvinylsilane, diethylaminomethylaminopropylvinylsilane, diethylaminomethylaminoisopropylvinylsilane, diethylaminomethylaminomethylphenylsilane, diethylaminomethylaminoethylphenylsilane, diethylaminomethylaminophenylpropylsilane, diethylaminomethylaminoisopropylphenylsilane, diethylaminomethylaminophenylvinylsilane, diethylaminomethylamino-n-butylmethylsilane, diethylaminomethylamino-n-butylethylsilane, diethylaminomethylamino-n-butylpropylsilane, diethylaminomethylamino-n-butylisopropylsilane, diethylaminomethylamino-n-butylvinylsilane, diethylaminomethylamino-n-butylphenylsilane, diethylaminomethylamino-s-butylmethylsilane, diethylaminomethylamino-s-butylethylsilane, diethylaminomethylamino-s-butylpropylsilane, diethylaminomethylamino-s-butylisopropylsilane, diethylaminomethylamino-s-butylvinylsilane, diethylaminomethylamino-s-butylphenylsilane, diethylaminomethylamino-n-butyl-s-butylsilane, diethylaminomethylamino-t-butylmethylsilane, diethylaminomethylamino-t-butylethylsilane, diethylaminomethylamino-t-butylpropylsilane, diethylaminomethylamino-t-butylisopropylsilane, diethylaminomethylamino-t-butylvinylsilane, diethylaminomethylamino-t-butylphenylsilane, diethylaminomethylamino-n-butyl-t-butylsilane, diethylaminomethylamino-s-butyl-t-butylsilane, diethylaminomethylaminomethylsilane, diethylaminomethylaminoethylsilane, diethylaminomethylaminopropylsilane, diethylaminomethylaminoisopropylsilane, diethylaminomethylaminovinylsilane, diethylaminomethylaminophenylsilane, diethylaminomethylamino-n-butylsilane, diethylaminomethylamino-s-butylsilane, diethylaminomethylamino-t-butylsilane, diethylaminomethylaminosilane, ethylaminodimethylaminodimethylsilane, ethylaminodimethylaminodiethylsilane, ethylaminodimethylaminodipropylsilane, ethylaminodimethylaminodiisopropylsilane, ethylaminodimethylaminodivinylsilane, ethylaminodimethylaminodiphenylsilane, ethylaminodimethylaminodi(n-butyl)silane, ethylaminodimethylaminodi(s-butyl)silane, ethylaminodimethylaminodi(t-butyl)silane, ethylaminodimethylaminoethylmethylsilane, ethylaminodimethylaminomethylpropylsilane, ethylaminodimethylaminoethylpropylsilane, ethylaminodimethylaminomethylisopropylsilane, ethylaminodimethylaminoethylisopropylsilane, ethylaminodimethylaminoisopropylpropylsilane, ethylaminodimethylaminomethylvinylsilane, ethylaminodimethylaminoethylvinylsilane, ethylaminodimethylaminopropylvinylsilane, ethylaminodimethylaminoisopropylvinylsilane, ethylaminodimethylaminomethylphenylsilnae, ethylaminodimethylaminoethylphenylsilane, ethylaminodimethylaminophenylpropylsilane, ethylaminodimethylaminoisopropylphenylsilane, ethylaminodimethylaminophenylvinylsilane, ethylaminodimethylamino-n-butylmethylsilane, ethylaminodimethylamino-n-butylethylsilane, ethylaminodimethylamino-n-butylpropylsilane, ethylaminodimethylamino-n-butylisopropylsilane, ethylaminodimethylamino-n-butylvinylsilane, ethylaminodimethylamino-n-butylphenylsilane, ethylaminodimethylamino-s-butylmethylsilane, ethylaminodimethylamino-s-butylethylsilane, ethylaminodimethylamino-s-butylpropylsilane, ethylaminodimethylamino-s-butylisopropylsilane, ethylaminodimethylamino-s-butylvinylsilane, ethylaminodimethylamino-s-butylphenylsilane, ethylaminodimethylamino-n-butyl-s-butylsilane, ethylaminodimethylamino-t-butylmethylsilane, ethylaminodimethylamino-t-butylethylsilane, ethylaminodimethylamino-t-butylpropylsilane, ethylaminodimethylamino-t-butylisopropylsilane, ethylaminodimethylamino-t-butylvinylsilane, ethylaminodimethylamino-t-butylphenylsilane, ethylaminodimethylamino-n-butyl-t-butylsilane, ethylaminodimethylamino-s-butyl-t-butylsilane, ethylaminodimethylaminomethylsilane, ethylaminodimethylaminoethylsilane, ethylaminodimethylaminopropylsilane, ethylaminodimethylaminoisopropylsilane, ethylaminodimethylaminovinylsilane, ethylaminodimethylaminophenylsilane, ethylaminodimethylamino-n-butylsilane, ethylaminodimethylamino-s-butylsilane, ethylaminodimethylamino-t-butylsilane, ethylaminodimethylaminosilane, diethylaminodimethylaminodimethylsilane, diethylaminodimethylaminodiethylsilane, diethylaminodimethylaminodipropylsilane, diethylaminodimethylaminodiisopropylsilane, diethylaminodimethylaminodivinylsilane, diethylaminodimethylaminodiphenylsilane, diethylaminodimethylaminodi(n-butyl)silane, diethylaminodimethylaminodi(s-butyl)silane, diethylaminodimethylaminodi(t-butyl)silane, diethylaminodimethylaminoethylmethylsilane, diethylaminodimethylaminomethylpropylsilane, diethylaminodimethylaminoethylpropylsilane, diethylaminodimethylaminomethylisopropylsilane, diethylaminodimethylaminoethylisopropylsilane, diethylaminodimethylaminoisopropylpropylsilane, diethylaminodimethylaminomethylvinylsilane, diethylaminodimethylaminoethylvinylsilane, diethylaminodimethylaminopropylvinylsilane, diethylaminodimethylaminoisopropylvinylsilane, diethylaminodimethylaminomethylphenylsilane, diethylaminodimethylaminoethylphenylsilane, diethylaminodimethylaminophenylpropylsilane, diethylaminodimethylaminoisopropylphenylsilane, diethylaminodimethylaminophenylvinylsilane, diethylaminodimethylamino-n-butylmethylsilane, diethylaminodimethylamino-n-butylethylsilane, diethylaminodimethylamino-n-butylpropylsilane, diethylaminodimethylamino-n- butylisopropylsilane, diethylaminodimethylamino-n-butylvinylsilane, diethylaminodimethylamino-n-butylphenylsilane, diethylaminodimethylamino-s-butylmethylsilane, diethylaminodimethylamino-s-butylethylsilane, diethylaminodimethylamino-s-butylpropylsilane, diethylaminodimethylamino-s-butylisopropylsilane, diethylaminodimethylamino-s-butylvinylsilane, diethylaminodimethylamino-s-butylphenylsilane, diethylaminodimethylamino-n-butyl-s-butylsilane, diethylaminodimethylamino-t-butylmethylsilane, diethylaminodimethylamino-t-butylethylsilane, diethylaminodimethylamino-t-butylpropylsilane, diethylaminodimethylamino-t-butylisopropylsilane, diethylaminodimethylamino-t-butylvinylsilane, diethylaminodimethylamino-t-butylphenylsilane, diethylaminodimethylamino-n-butyl-t-butylsilane, diethylaminodimethylamino-s-butyl-t-butylsilane, diethylaminodimethylaminomethylsilane, diethylaminodimethylaminoethylsilane, diethylaminodimethylaminopropylsilane, diethylaminodimethylaminoisopropylsilane, diethylaminodimethylaminovinylsilane, diethylaminodimethylaminophenylsilane, diethylaminodimethylamino-n-butylsilane, diethylaminodimethylamino-s-butylsilane, diethylaminodimethylamino-t-butylsilane, diethylaminodimethylaminosilane, bis(ethylamino)methylaminomethylsilane, bis(ethylamino)methylaminoethylsilane, bis(ethylamino)methylaminopropylsilane, bis(ethylamino)methylaminoisopropylsilane, bis(ethylamino)methylaminovinylsilane, bis(ethylamino)methylaminophenylsilane, bis(ethylamino)methylamino-n-butylsilane, bis(ethylamino)methylamino-s-butylsilane, bis(ethylamino)methylamino-t-butylsilane, bis(ethylamino)methylaminosilane, bis(ethylamino)diethylaminomethylsilane, bis(ethylamino)diethylaminoethylsilane, bis(ethylamino)diethylaminopropylsilane, bis(ethylamino)diethylaminoisopropylsilane, bis(ethylamino)diethylaminovinylsilane, bis(ethylamino)diethylaminophenylsilane, bis(ethylamino)diethylamino-n-butylsilane, bis(ethylamino)diethylamino-s-butylsilane, bis(ethylamino)diethylamino-t-butylsilane, bis(ethylamino)diethylaminosilane, bis(ethylamino)dimethylaminomethylsilane, bis(ethylamino)dimethylaminoethylsilane, bis(ethylamino)dimethylaminopropylsilane, bis(ethylamino)dimethylaminoisopropylsilane, bis(ethylamino)dimethylaminovinylsilane, bis(ethylamino)dimethylaminophenylsilane, bis(ethylamino)dimethylamino-n-butylsilane, bis(ethylamino)dimethylamino-s-butylsilane, bis(ethylamino)dimethylamino-t-butylsilane, bis(ethylamino)dimethylaminosilane, bis(methylamino)ethylaminomethylsilane, bis(methylamino)ethylaminoethylsilane, bis(methylamino)ethylaminopropylsilane, bis(methylamino)ethylaminoisopropylsilane, bis(methylamino)ethylaminovinylsilane, bis(methylamino)ethylaminophenylsilane, bis(methylamino)ethylamino-n-butylsilane, bis(methylamino)ethylamino-s-butylsilane, bis(methylamino)ethylamino-t-butylsilane, bis(methylamino)ethylaminosilane, bis(methylamino)diethylaminomethylsilane, bis(methylamino)diethylaminoethylsilane, bis(methylamino)diethylaminopropylsilane, bis(methylamino)diethylaminoisopropylsilane, bis(methylamino)diethylaminovinylsilane, bis(methylamino)diethylaminophenylsilane, bis(methylamino)diethylamino-n-butylsilane, bis(methylamino)diethylamino-s-butylsilane, bis(methylamino)diethylamino-t-butylsilane, bis(methylamino)diethylaminosilane, bis(methylamino)dimethylaminomethylsilane, bis(methylamino)dimethylaminoethylsilane, bis(methylamino)dimethylaminopropylsilane, bis(methylamino)dimethylaminoisopropylsilane, bis(methylamino)dimethylaminovinylsilane, bis(methylamino)dimethylaminophenylsilane, bis(methylamino)dimethylamino-n-butylsilane, bis(methylamino)dimethylamino-s-butylsilane, bis(methylamino)dimethylamino-t-butylsilane, bis(methylamino)dimethylaminosilane, bis(diethylamino)ethylaminomethylsiane, bis(diethylamino)ethylaminoethylsilane, bis(diethylamino)ethylaminopropylsilane, bis(diethylamino)ethylaminoisopropylsilane, bis(diethylamino)ethylaminovinylsilane, bis(diethylamino)ethylaminophenylsilane, bis(diethylamino)ethylamino-n-butylsilane, bis(diethylamino)ethylamino-s-butylsilane, bis(diethylamino)ethylamino-t-butylsilane, bis(diethylamino)ethylaminosilane, bis(diethylamino)methylaminomethylsilane, bis(diethylamino)methylaminoethylsilane, bis(diethylamino)methylaminopropylsilane, bis(diethylamino)methylaminoisopropylsilane, bis(diethylamino)methylaminovinylsilane, bis(diethylamino)methylaminophenylsilane, bis(diethylamino)methylamino-n-butylsilane, bis(diethylamino)methylamino-s-butylsilane, bis(diethylamino)methylamino-t-butylsilane, bis(diethylamino)methylaminosilane, bis(diethylamino)dimethylaminomethylsilane, bis(diethylamino)dimethylaminoethylsilane, bis(diethylamino)dimethylaminopropylsilane, bis(diethylamino)dimethylaminoisopropylsilane, bis(diethylamino)dimethylaminovinylsilane, bis(diethylamino)dimethylaminophenylsilane, bis(diethylamino)dimethylamino-n-butylsilane, bis(diethylamino)dimethylamino-s-butylsilane, bis(diethylamino)dimethylamino-t-butylsilane, bis(diethylamino)dimethylaminosilane, bis(diethylamino)ethylaminomethylsilane, bis(diethylamino)ethylaminoethylsilane, bis(diethylamino)ethylaminopropylsilane, bis(diethylamino)ethylaminoisopropylsilane, bis(diethylamino)ethylaminovinylsilane, bis(diethylamino)ethylaminophenylsilane, bis(dimethylamino)ethylamino-n-butylsilane, bis(dimethylamino)ethylamino-s-butylsilane, bis(dimethylamino)ethylamino-t-butylsilane, bis(dimethylamino)ethylaminosilane, bis(dimethylamino)methylaminomethylsilane, bis(dimethylamino)methylaminoethylsilane, bis(dimethylamino)methylaminopropylsilane, bis(dimethylamino)methylaminoisopropylsilane, bis(dimethylamino)methylaminovinylsilane, bis(dimethylamino)methylaminophenylsilane, bis(dimethylamino)methylamino-n-butylsilane, bis(dimethylamino)methylamino-s-butylsilane, bis(dimethylamino)methylamino-t-butylsilane, bis(dimethylamino)methylaminosilane, bis(dimethylamino)diethylaminomethylsilane, bis(dimethylamino)diethylaminoethylsilane, bis(dimethylamino)diethylaminopropylsilane, bis(dimethylamino)diethylaminoisopropylsilane, bis(dimethylamino)diethylaminovinylsilane, bis(dimethylamino)diethylaminophenylsilane, bis(dimethylamino)diethylamino-n-butylsilane, bis(dimethylamino)diethylamino-s-butylsilane, bis(dimethylamino)diethylamino-t-butylsilane, bis(dimethylamino)diethylaminosilane, ethylaminomethylaminodiethylaminomethylsilane, ethylaminomethylaminodiethylaminoethylsilane, ethylaminomethylaminodiethylaminopropylsilane, ethylaminomethylaminodiethylaminoisopropylsilane, ethylaminomethylaminodiethylaminovinylsilane, ethylaminomethylaminodiethylaminophenylsilane, ethylaminomethylaminodiethylamino-n-butylsilane, ethylaminomethylaminodiethylamino-s-butylsilane, ethylaminomethylaminodiethylamino-t-butylsilane, ethylaminomethylaminodiethylaminosilane, ethylaminomethylaminodimethylaminosilane, ethylaminomethylaminodimethylaminomethylsilane, ethylaminomethylaminodimethylaminoethylsilane, ethylaminomethylaminodimethylaminopropylsilane, ethylaminomethylaminodimethylaminoisopropylsilane, ethylaminomethylaminodimethylaminovinylsilane, ethylaminomethylaminodimethylaminophenylsilane, ethylaminomethylaminodimethylamino-n-butylsilane, ethylaminomethylaminodimethylamino-s-butylsilane, ethylaminomethylaminodimethylamino-t-butylsilane, ethylaminomethylaminodimethylaminosilane, ethylaminodiethylaminodimethylaminomethylsilane, ethylaminodiethylaminodimethylaminoethylsilane, ethylaminodiethylaminodimethylaminopropylsilane, ethylaminodiethylaminodimethylaminoisopropylsilane, ethylaminodiethylaminodimethylaminovinylsilane, ethylaminodiethylaminodimethylaminophenylsilane, ethylaminodiethylaminodimethylamino-n-butylsilane, ethylaminodiethylaminodimethylamino-n-butylsilane, ethylaminodiethylaminodimethylamino-t-butylsilane, ethylaminodiethylaminodimethylaminosilane, methylaminodiethylaminodimethylaminomethylsilane, methylaminodiethylaminodimethylaminoethylsilane, methylaminodiethylaminodimethylaminopropylsilane, methylaminodiethylaminodimethylaminoisopropylsilane, methylaminodiethylaminodimethylaminovinylsilane, methylaminodiethylaminodimethylaminophenylsilane, methylaminodiethylaminodimethylamino-n-butylsilane, methylaminodiethylaminodimethylamino-s-butylsilane, methylaminodiethylaminodimethylamino-t-butylsilane, methylaminodiethylaminodimethylaminosilane, tetrakis(dimethylamino)silane, tetrakis(diethylamino)silane, tetrakis(methylamino)silane, tetrakis(ethylamino)silane, tris(dimethylamino)diethylaminosilane, tris(dimethylamino)dimethylaminosilane, tris(dimethylamino)ethylaminosilane, tris(diethylamino)dimethylaminosilane, tris(diethylamino)ethylaminosilane, tris(methylamino)diethylaminosilane, tris(methylamino)dimethylaminosilane, tris(methylamino)diethylaminosilane, tris(ethylamino)dimethylaminosilane, tris(ethylamino)dimethylaminosilane, tris(ethylamino)diethylaminosilane, bis(dimethylamino)bis(diethylamino)silane, bis(dimethylamino)bis(methylamino)silane, bis(dimethylamino)bis(ethylamino)silane, bis(diethylamino)bis(dimethylamino)silane, bis(diethylamino)bis(methylamino)silane, bis(diethylamino)bis(ethylamino)silane, bis(methylamino)bis(diethylamino)silane, bis(methylamino)bis(dimethylamino)silane, bis(methylamino)bis(ethylamino)silane, bis(ethylamino)bis(dimethylamino)silane, bis(ethylamino)bis(methylamino)silane, bis(ethylamino)bis(diethylamino)silane, bis(dimethylamino)diethylaminomethylaminosilane, bis(dimethylamino)ethylaminomethylaminosilane, bis(dimethylamino)ethylaminodiethylaminosilane, bis(diethylamino)methylaminodimethylaminosilane, bis(diethylamino)ethylaminomethylaminosilane, bis(diethylamino)ethylaminodimethylaminosilane, bis(methylamino)diethylaminodimethylaminosilane, bis(methylamino)ethylaminodimethylaminosilane, bis(methylamino)ethylaminodiethylaminosilane, bis(ethylamino)methylaminodimethylaminosilane, bis(ethylamino)diethylaminodimethylaminosilane, bis(ethylamino)methylaminodiethylaminosilane, ethylaminodiethylaminomethylaminodimethylaminosilane, chloro(dimethylamino)dimethylsilane, chloro(dimethylamino)diethylsilane, chloro(dimethylamino)dipropylsilane, chloro(dimethylamino)diisopropylsilane, chloro(dimethylamino)divinylsilane, chloro(dimethylamino)diphenylsilane, chloro(dimethylamino)di(n-butyl)silane, chloro(dimethylamino)di(s-butyl)silane, chloro(dimethylamino)di(t-butyl)silane, chloro(dimethylamino)ethylmethylsilane, chloro(dimethylamino)methylpropylsilane, chloro(dimethylamino)ethylpropylsilane, chloro(dimethylamino)methylisopropylsilane, chloro(dimethylamino)ethylisopropylsilane, chloro(dimethylamino)isopropylpropylsilane, chloro(dimethylamino)methylvinylsilane, chloro(dimethylamino)ethylvinylsilane, chloro(dimethylamino)propylvinylsilane, chloro(dimethylamino)isopropylvinylsilane, chloro(dimethylamino)methylphenylsilane, chloro(dimethylamino)ethylphenylsilane, chloro(dimethylamino)phenylpropylsilane, chloro(dimethylamino)isopropylphenylsilane, chloro(dimethylamino)phenylvinylsilane, chloro(dimethylamino)-n-butylmethylsilane, chloro(dimethylamino)-n-butylethylsilane, chloro(dimethylamino)-n-butylpropylsilane, chloro(dimethylamino)-n-butylisopropylsilane, chloro(dimethylamino)-n-butylvinylsilane, chloro(dimethylamino)n-butylphenylsilane, chloro(dimethylamino)-s-butylmethylsilane, chloro(dimethylamino)-s-butylethylsilane, chloro(dimethylamino)-s-butylpropylsilane, chloro(dimethylamino)-s-butylisopropylsilane, chloro(dimethylamino)-s-butylvinylsilane, chloro(dimethylamino)-s-butylphenylsilane, chloro(dimethylamino)-n-butyl-s-butylsilane, chloro(dimethylamino)-t-butylmethylsilane, chloro(dimethylamino)-t-butylethylsilane, chloro(dimethylamino)-t-butylpropylsilane, chloro(dimethylamino)-t-butylisopropylsilane, chloro(dimethylamino)-t-butylvinylsilane, chloro(dimethylamino)-t-butylphenylsilane, chloro(dimethylamino)-n-butyl-t-butylsilane, chloro(dimethylamino)-s-butyl-t-butylsilane, chloro(dimethylamino)methylsilane, chloro(dimethylamino)ethylsilane, chloro(dimethylamino)propylsilane, chloro(dimethylamino)isopropylsilane, chloro(dimethylamino)vinylsilane, chloro(dimethylamino)phenylsilane, chloro(dimethylamino)-n-butylsilane, chloro(dimethylamino)-s-butylsilane, chloro(dimethylamino)-t-butylsilane, chloro(dimethylamino)silane, chloro(diethylamino)dimethylsilane, chloro(diethylamino)diethylsilane, chloro(diethylamino)dipropylsilane, chloro(diethylamino)diisopropylsilane, chloro(diethylamino)divinylsilane, chloro(diethylamino)diphenylsilane, chloro(diethylamino)di(n-butyl)silane, chloro(diethylamino)di(s-butyl)silane, chloro(diethylamino)di(t-butyl)silane, chloro(diethylamino)ethylmethylsilane, chloro(diethylamino)methylpropylsilane, chloro(diethylamino)ethylpropylsilane, chloro(diethylamino)methylisopropylsilane, chloro(diethylamino)ethylisopropylsilane, chloro(diethylamino)isopropylpropylsilane, chloro(diethylamino)methylvinylsilane, chloro(diethylamino)ethylvinylsilane, chloro(diethylamino)propylvinylsilane, chloro(diethylamino)isopropylvinylsilane, chloro(diethylamino)methylphenylsilane, chloro(diethylamino)ethylphenylsilane, chloro(diethylamino)phenylpropylsilane, chloro(diethylamino)isopropylphenylsilane, chloro(diethylamino)phenylvinylsilane, chloro(diethylamino)-n-butylmethylsilane, chloro(diethylamino)-n-butylethylsilane, chloro(diethylamino)-n-butylpropylsilane, chloro(diethylamino)-n-butylisopropylsilane, chloro(diethylamino)-n-butylvinylsilane, chloro(diethylamino)-n-butylphenylsilane, chloro(diethylamino)-s-butylmethylsilane, chloro(diethylamino)-s-butylethylsilane, chloro(diethylamino)-s-butylpropylsilane, chloro(diethylamino)-s-butylisopropylsilane, chloro(diethylamino)-s-butylvinylsilane, chloro(diethylamino)-s-butylphenylsilane, chloro(diethylamino)-n-butyl-s-butylsilane, chloro(diethylamino)-t-butylmethylsilane, chloro(diethylamino)-t-butylethylsilane, chloro(diethylamino)-t-butylpropylsilane, chloro(diethylamino)-t-butylisopropylsilane, chloro(diethylamino)-t-butylvinylsilane, chloro(diethylamino)-t-butylphenylsilane, chloro(diethylamino)-n-butyl-t-butylsilane, chloro(diethylamino)-s-butyl-t-butylsilane, chloro(diethylamino)methylsilane, chloro(diethylamino)ethylsilane, chloro(diethylamino)propylsilane, chloro(diethylamino)isopropylsilane, chloro(diethylamino)vinylsilane, chloro(diethylamino)phenylsilane, chloro(diethylamino)-n-butylsilane, chloro(diethylamino)-s-butylsilane, chloro(diethylamino)-t-butylsilane, chloro(diethylamino)silane, chloro(methylamino)dimethylsilane, chloro(methylamino)diethylsilane, chloro(methylamino)dipropylsilane, chloro(methylamino)diisopropylsilane, chloro(methylamino)divinylsilane, chloro(methylamino)diphenylsilane, chloro(methylamino)di(n-butyl)silane, chloro(methylamino)di(s-butyl)silane, chloro(methylamino)di(t-butyl)silane, chloro(methylamino)ethylmethylsilane, chloro(methylamino)methylpropylsilane, chloro(methylamino)ethylpropylsilane, chloro(methylamino)methylisopropylsilane, chloro(methylamino)ethylisopropylsilane, chloro(methylamino)isopropylpropylsilane, chloro(methylamino)methylvinylsilane, chloro(methylamino)ethylvinylsilane, chloro(methylamino)propylvinylsilane, chloro(methylamino)isopropylvinylsilane, chloro(methylamino)methylphenylsilane, chloro(methylamino)ethylphenylsilane, chloro(methylamino)phenylpropylsilane, chloro(methylamino)isopropylphenylsilane, chloro(methylamino)phenylvinylsilane, chloro(methylamino)-n-butylmethylsilane, chloro(methylamino)-n-butylethylsilane, chloro(methylamino)-n-butylpropylsilane, chloro(methylamino)-n-butylisopropylsilane, chloro(methylamino)-n-butylvinylsilane, chloro(methylamino)-n-butylphenylsilane, chloro(methylamino)-s-butylmethylsilane, chloro(methylamino)-s-butylethylsilane, chloro(methylamino)-s-butylpropylsilane, chloro(methylamino)-s-butylisopropylsilane, chloro(methylamino)-s-butylvinylsilane, chloro(methylamino)-s-butylphenylsilane, chloro(methylamino)-n-butyl-s-butylsilane, chloro(methylamino)-t-butylmethylsilane, chloro(methylamino)-t-butylethylsilane, chloro(methylamino)-t-butylpropylsilane, chloro(methylamino)-t-butylisopropylsilane, chloro(methylamino)-t-butylvinylsilane, chloro(methylamino)-t-butylphenylsilane, chloro(methylamino)-n-butyl-t-butylsilane, chloro(methylamino)-s-butyl-t-butylsilane, chloro(methylamino)methylsilane, chloro(methylamino)ethylsilane, chloro(methylamino)propylsilane, chloro(methylamino)isopropylsilane, chloro(methylamino)vinylsilane, chloro(methylamino)phenylsilane, chloro(methylamino)-n-butylsilane, chloro(methylamino)-s-butylsilane, chloro(methylamino)-t-butylsilane, chloro(methylamino)silane, aminochloro(ethylamino)dimethylsilane, chloro(ethylamino)diethylsilane, chloro(ethylamino)dipropylsilane, chloro(ethylamino)diisopropylsilane, chloro(ethylamino)divinylsilane, chloro(ethylamino)diphenylsilane, chloro(ethylamino)di(n-butyl)silane, chloro(ethylamino)di(s-butyl)silane, chloro(ethylamino)di(t-butyl)silane, chloro(ethylamino)ethylmethylsilane, chloro(ethylamino)methylpropylsilane, chloro(ethylamino)ethylpropylsilane, chloro(ethylamino)methylisopropylsilane, chloro(ethylamino)ethylisopropylsilane, chloro(ethylamino)isopropylpropylsilane, chloro(ethylamino)methylvinylsilane, chloro(ethylamino)ethylvinylsilane, chloro(ethylamino)propylvinylsilane, chloro(ethylamino)isopropylvinylsilane, chloro(ethylamino)methylphenylsilane, chloro(ethylamino)ethylphenylsilane, chloro(ethylamino)phenylpropylsilane, chloro(ethylamino)isopropylphenylsilane, chloro(ethylamino)phenylvinylsilane, chloro(ethylamino)-n-butylmethylsilane, chloro(ethylamino)-n-butylethylsilane, chloro(ethylamino)-n-butylpropylsilane, chloro(ethylamino)-n-butylisopropylsilane, chloro(ethylamino)-n-butylvinylsilane, chloro(ethylamino)-n-butylphenylsilane, chloro(ethylamino)-s-butylmethylsilane, chloro(ethylamino)-s-butylethylsilane, chloro(ethylamino)-s-butylpropylsilane, chloro(ethylamino)-s-butylisopropylsilane, chloro(ethylamino)-s-butylvinylsilane, chloro(ethylamino)-s-butylphenylsilane, chloro(ethylamino)-n-butyl-s-butylsilane, chloro(ethylamino)-t-butylmethylsilane, chloro(ethylamino)-t-butylethylsilane, chloro(ethylamino)-t-butylpropylsilane, chloro(ethylamino)-t-butylisopropylsilane, chloro(ethylamino)-t-butylvinylsilane, chloro(ethylamino)-t-butylphenylsilane, chloro(ethylamino)-n-butyl-t-butylsilane, chloro(ethylamino)-s-butyl-t-butylsilane, chloro(ethylamino)methylsilane, chloro(ethylamino)ethylsilane, chloro(ethylamino)propylsilane, chloro(ethylamino)isopropylsilane, chloro(ethylamino)vinylsilane, chloro(ethylamino)phenylsilane, chloro(ethylamino)-n-butylsilane, chloro(ethylamino)-s-butylsilane, chloro(ethylamino)-t-butylsilane, chloro(ethylamino)silane, dichloro(dimethylamino)methylsilane, dichloro(dimethylamino)ethylsilane, dichloro(dimethylamino)propylsilane, dichloro(dimethylamino)isopropylsilane, dichloro(dimethylamino)vinylsilane, dichloro(dimethylamino)phenylsilane, dichloro(dimethylamino)-n-butylsilane, dichloro(dimethylamino)-s-butylsilane, dichloro(dimethylamino)-t-butylsilane, dichloro(dimethylamino)silane, dichloro(diethylamino)methylsilane, dichloro(diethylamino)ethylsilane, dichloro(diethylamino)propylsilane, dichloro(diethylamino)isopropylsilane, dichloro(diethylamino)vinylsilane, dichloro(diethylamino)phenylsilane, dichloro(diethylamino)-n-butylsilane, dichloro(diethylamino)-s-butylsilane, dichloro(diethylamino)-t-butylsilane, dichloro(diethylamino)silane, dichloro(methylamino)methylsilane, dichloro(methylamino)ethylsilane, dichloro(methylamino)propylsilane, dichloro(methylamino)isopropylsilane, dichloro(methylamino)vinylsilane, dichloro(methylamino)phenylsilane, dichloro(methylamino)-n-butylsilane, dichloro(methylamino)-s-butylsilane, dichloro(methylamino)-t-butylsilane, dichloro(methylamino)silane, dichloro(ethylamino)methylsilane, dichloro(ethylamino)ethylsilane, dichloro(ethylamino)propylsilane, dichloro(ethylamino)isopropylsilane, dichloro(ethylamino)vinylsilane, dichloro(ethylamino)phenylsilane, dichloro(ethylamino)-n-butylsilane, dichloro(ethylamino)-s-butylsilane, dichloro(ethylamino)-t-butylsilane, dichloro(ethylamino)silane, trichloro(dimethylamino)silane, trichloro(diethylamino)silane, trichloro(methylamino)silane, trichloro(ethylamino)silane, bis(dimethylamino)chloromethylsilane, bis(dimethylamino)chloroethylsilane, bis(dimethylamino)chloropropylsilane, bis(dimethylamino)chloroisopropylsilane, bis(dimethylamino)chlorovinylsilane, bis(dimethylamino)chlorophenylsilane, bis(dimethylamino)chloro-n-butylsilane, bis(dimethylamino)chloro-s-butylsilane, bis(dimethylamino)chloro-t-butylsilane, bis(dimethylamino)chlorosilane, bis(diethylamino)chloromethylsilane, bis(diethylamino)chloroethylsilane, bis(diethylamino)chloropropylsilane, bis(diethylamino)chloroisopropylsilane, bis(diethylamino)chlorovinylsilane, bis(diethylamino)chlorophenylsilane, bis(diethylamino)chloro-n-butylsilane, bis(diethylamino)chloro-s-butylsilane, bis(diethylamino)chloro-t-butylsilane, bis(diethylamino)chlorosilane, bis(methylamino)chloromethylsilane, bis(methylamino)chloroethylsilane, bis(methylamino)chloropropylsilane, bis(methylamino)chloroisopropylsilane, bis(methylamino)chlorovinylsilane, bis(methylamino)chlorophenylsilane, bis(methylamino)chloro-n-butylsilane, bis(methylamino)chloro-s-butylsilane, bis(methylamino)chloro-t-butylsilane, bis(methylamino)chlorosilane, bis(ethylamino)chloromethylsilane, bis(ethylamino)chloroethylsilane, bis(ethylamino)chloropropylsilane, bis(ethylamino)chloroisopropylsilane, bis(ethylamino)chlorovinylsilane, bis(ethylamino)chlorophenylsilane, bis(ethylamino)chloro-n-butylsilane, bis(ethylamino)chloro-s-butylsilane, bis(ethylamino)chloro-t-butylsilane, bis(ethylamino)chlorosilane, dimethylaminodiethylaminochloromethylsilane, dimethylaminodiethylaminochloroethylsilane, dimethylaminodiethylaminochloropropylsilane, dimethylaminodiethylaminochloroisopropylsilane, dimethylaminodiethylaminochlorovinylsilane, dimethylaminodiethylaminochlorophenylsilane, dimethylaminodiethylaminochloro-n-butylsilane, dimethylaminodiethylaminochloro-s-butylsilane, dimethylaminodiethylaminochloro-t-butylsilane, dimethylaminodiethylaminochlorosilane, methylaminodiethylaminochloromethylsilane, methylaminodiethylaminochloroethylsilane, methylaminodiethylaminochloropropylsilane, methylaminodiethylaminochloroisopropylsilane, methylaminodiethylaminochlorovinylsilane, methylaminodiethylaminochlorophenylsilane, methylaminodiethylaminochloro-n-butylsilane, methylaminodiethylaminochloro-s-butylsilane, methylaminodiethylaminochloro-t-butylsilane, methylaminondiethylaminochlorosilane, dimethylaminoethylaminochloromethylsilane, dimethylaminoethylaminochloroethylsilane, dimethylaminoethylaminochloropropylsilane, dimethylaminoethylaminochloroisopropylsilane, dimethylaminoethylaminochlorovinylsilane, dimethylaminoethylaminochlorophenylsilane, dimethylaminoethylaminochloro-n-butylsilane, dimethylaminoethylaminochloro-s-butylsilane, dimethylaminoethylaminochloro-t-butylsilane, dimethylaminoethylaminochlorosilane, methylaminoethylaminochloromethylsilane, methylaminoethylaminochloroethylsilane, methylaminoethylaminochloropropylsilane, methylaminoethylaminochloroisopropylsilane, methylaminoethylaminochlorovinylsilane, methylaminoethylaminochlorophenylsilane, methylaminoethylaminochloro-n-butylsilane, methylaminoethylaminochloro-s-butylsilane, methylaminoethylaminochloro-t-butylsilane, methylaminoethylaminochlorosilane, methylaminodimethylaminochloromethylsilane, methylaminodimethylaminochloroethylsilane, methylaminodimethylaminochloropropylsilane, methylaminodimethylaminochloroisopropylsilane, methylaminodimethylaminochlorovinylsilane, methylaminodimethylaminochlorophenylsilane, methylaminodimethylaminochloro-n-butylsilane, methylaminodimethylaminochloro-s-butylsilane, methylaminodimethylaminochloro-t-butylsilane, methylaminodimethylaminochlorosilane, ethylaminodiethylaminochloromethylsilane, ethylaminodiethylaminochloroethylsilane, ethylaminodiethylaminochloropropylsilane, ethylaminodiethylaminochloroisopropylsilane, ethylaminodiethylaminochlorovinylsilane, ethylaminodiethylaminochlorophenylsilane, ethylaminodiethylaminochloro-n-butylsilane, ethylaminodiethylaminochloro-s-butylsilane, ethylaminodiethylaminochloro-t-butylsilane, ethylaminodiethylaminochlorosilane, dimethylaminodiethylaminodichlorosilane, dimethylaminoethylaminodichlorosilane, methylaminodiethylaminodichlorosilane, methylaminoethylaminodichlorosilane, methylaminomethylaminodichlorosilane, ethylaminoethylaminodichlorosilane, tris(dimethylamino)chlorosilane, tris(diethylamino)chlorosilane, tris(methylamino)chlorosilane, tris(ethylamino)chlorosilane, bis(dimethylamino)ethylaminochlorosilane, bis(dimethylamino)diethylaminochlorosilane, bis(dimethylamino)methylaminochlorosilane, bis(diethylamino)dimethylaminochlorosilane, bis(diethylamino)ethylaminochlorosilane, bis(diethylamino)methylaminochlorosilane, bis(methylamino)dimethylaminochlorosilane, bis(methylamino)diethylaminochlorosilane, bis(methylamino)ethylaminochlorosilane, bis(ethylamino)dimethylaminochlorosilane, bis(ethylamino)diethylaminochlorosilane, bis(ethylamino)methylaminochlorosilane, ethylaminodiethylaminomethylaminochlorosilane, ethylaminodiethylaminodimethylaminochlorosilane, ethylaminomethylaminodimethylaminochlorosilane, diethylaminomethylaminodimethylaminochlorosilane, dichlorosilane, dichloromethylsilane, dichloroethylsilane, dichloropropylsilane, dichloroisopropylsilane, dichlorovinylsilane, dichlorophenylsilane, dichloro-n-butylsilane, dichloro-s-butylsilane, dichloro-t-butylsilane, dichlorodimethylsilane, dichlorodiethylsilane, dichlorodipropylsilane, dichlorodiisopropylsilane, dichlorodivinylsilane, dichlorodiphenylsilane, dichlorodi(n-butyl)silane, dichlorodi(s-butyl)silane, dichlorodi(t-butyl)silane, dichloroethylmethylsilane, dichloromethylpropylsilane, dichloroethylpropylsilane, dichloromethylisopropylsilane, dichloroethylisopropylsilane, dichloroisopropylpropylsilane, dichloromethylvinylsilane, dichloroethylvinylsilane, dichloropropylvinylsilane, dichloroisopropylvinylsilane, dichloromethylphenylsilane, dichloroethylphenylsilane, dichlorophenylpropylsilane, dichloroisopropylphenylsilane, dichlorophenylvinylsilane, dichloro-n-butylmethylsilane, dichloro-n-butylethylsilane, dichloro-n-butylpropylsilane, dichloro-n-butylisopropylsilane, dichloro-n-butylvinylsilane, dichloro-n-butylphenylsilane, dichloro-s-butylmethylsilane, dichloro-s-butylethylsilane, dichloro-s-butylpropylsilane, dichloro-s-butylisopropylsilane, dichloro-s-butylvinylsilane, dichloro-s-butylphenylsilane, dichloro-n-butyl-s-butylsilane, dichloro-t-butylmethylsilane, dichloro-t-butylethylsilane, dichloro-t-butylpropylsilane, dichloro-t-butylisopropylsilane, dichloro-t-butylvinylsilane, dichloro-t-butylphenylsilane, dichloro-n-butyl-t-butylsilane, dichloro-s-butyl-t-butylsilane, trichlorosilane, trichloromethylsilane, trichloroethylsilane, trichloropropylsilane, trichloroisopropylsilane, trichlorovinylsilane, trichlorophenylsilane, trichloro-n-butylsilane, trichloro-s-butylsilane, trichloro-t-butylsilane, tetrachlorosilane, acetoxyethylmethyldichlorosilane, acetoxypropylmethyldichlorosilane, (3-acryloxypropyl)methyldichlorosilane, (3-acryloxypropyl)trichlorosilane, adamantylethyltrichlorosilane, allyl(chloropropyl)dichlorosilane, allyldichlorosilane, allylmethyldichlorosilane, allylphenyldichlorosilane, allyltrichlorosilane, benzyltrichlorosilane, {(bicycloheptenyl)ethyl}trichlorosilane, 5-(bicycloheptenyl)methyldichlorosilane, 5-(bicycloheptenyl)trichlorosilane, 2-(bicycloheptyl)trichlorosilane, bis(chloromethyl)dichlorosilane, bis(cyanopropyl)dichlorosilane, bis(dichlorosilyl)methane, bis(methyldichlorosilyl)butane, bis(methyldichlorosilyl)ethane, bis(trichlorosilyl)ethane, bis(trichlorosilyl)acetylene, bis(trichlorosilyl)methane, bis(trimethylsilylmethyl)dichlorosilane, 2-bromoethyltrichlorosilane, bromophenyltrichlorosilane, 3-bromopropyltrichlorosilane, butenylmethyldichlorosilane, p-(t-butyl)phenethyltrichlorosilane, 2-(carbomethoxy)ethylmethyldichlorosilane, 2-(carbomethoxy)ethyltrichlorosilane, 2-chloroethylmethyldichlorosilane, 1-chloroethyltrichlorosilane, 2-chloroethyltrichlorosilane, chloromethylmethyldichlorosilane, {(chloromethyl)phenylethyl}methyldichlorosilane, {(chloromethyl)phenylethyl}trichlorosilane, (p-chloromethyl)phenyltrichlorosilane, chloromethyltrichlorosilane, chlorophenylmethyldichlorosilane, chlorophenyltrichlorosilane, 3-chloropropylmethyldichlorosilane, 3-chloropropyltrichlorosilane, 2-cyanoethylmethyldichlorosilane, 2-cyanoethyltrichlorosilane, (3-cyanoisobutyl)methyldichlorosilane, (3-cyanoisobutyl)trichlorosilane, 3-cyanopropylmethyldichlorosilane, 3-cyanopropylphenyldichlorosilane, 3-cyanopropyltrichlorosilane, {2-(3-cyclohexenyl)ethyl}methyldichlorosilane, {2-(3-cyclohexenyl)ethyl}trichlorosilane, 3-cyclohexenyltrichlorosilane, cyclohexylmethyldichlorosilane, (cyclohexylmethyl)trichlorosilane, cyclohexyltrichlorosilane, (4-cyclooctenyl)trichlorosilane, cyclooctyltrichlorosilane, cyclopentyltrichlorosilane, cyclotetramethylenedichlorosilane, cyclotrimethylenedichlorosilane, n-decylmethyldichlorosilane, n-decyltrichlorosilane, (dichloromethyl)methyldichlorosilane, dichlorophenyltrichlorosilane, dicyclohexyldichlorosilane, dicyclopentyldichlorosilane, diethoxydichlorosilane, di-n-hexyldichlorosilane, dimethylbis(s-butylamino)silane, di-n-octyldichlorosilane, di(p-tolyl)dichlorosilane, dodecylmethyldichlorosilane, n-heptylmethyldichlorosilane, n-heptyltrichlorosilane, hexachlorodisilane, hexachlorodisiloxane, 1,1,3,3,5,5-hexamethylcyclotrisilazane, 1,2,3,4,5,6-hexamethylcyclotrisilazane, 5-hexenyltrichlorosilane, hexyldichlorosilane, hexylmethyldichlorosilane, hexyltrichlorosilane, isooctyltrichlorosilane, methacryloxypropylmethyldichlorosilane, methacryloxypropyltrichlorosilane, 3-(p-methoxyphenyl)propylmethyldichlorosilane, 3-(p-methoxyphenyl)propyltrichlorosilane, (p-methylphenethyl)methyldichlorosilane, (2-methyl-2-phenylethyl)methyldichlorosilane, octamethylcyclotetrasilazane, 1,2,3,4,5,6,7,8-octamethylcyclotetrasilazane, 7-octenyltrichlorosilane, n-octylmethyldichlorosilane, n-octyltrichlorosilane, pentyltrichlorosilane, phenethylmethyldichlorosilane, phenethyltrichlorosilane, 3-phenoxypropyltrichlorosilane, 4-phenylbutylmethyldichlorosilane, 4-phenylbutyltrichlorosilane, (3-phenylpropyl)methyldichlorosilane, 1-propenylmethyldichlorosilane, 1,1,3,3-tetrachloro-1,3-disilabutane, 1,3,5,7-tetravinyl-1,3,5,7-tetramethylcyclotetrasilazane, t-hexyltrichlorosilane, p-tolylmethyldichlorosilane, p-tolyltrichlorosilane, trichloromethyltrichlorosilane, 2-{2-(trichlorosilyl)ethyl}pyridine, 4-{2-trichlorosilyl)ethyl}pyridine, (3,3,3-trifluoropropyl)trichlorosilane, 1,3,5-trivinyl-1,3,5-trimethylcyclotrisilazane, 10-undecenyltrichlorosilane, undecyltrichlorosilane and vinyloctyldichlorosilane.

Following the above treatment, it is desirable to treat the interfacial roughness reducing film with a compound having exactly one Si—N bond or Si—Cl bond per molecule. This is because the Si—O bonds which form react with the unreacted, highly reactive moieties (e.g., SiOH, and residual Si—N bonds and Si—Cl bonds) remaining in the interfacial roughness reducing film, capping the ends and thereby preventing the adsorption of moisture and the like, thus making it possible to increase the stability as an insulating film. The condition of having "exactly one Si—N bond or Si—Cl bond" is essential for capping the ends.

Treatment in this case signifies bringing the interfacial roughness reducing film following the above-described treatment into contact with a compound having exactly one Si—N bond or Si—Cl bond per molecule, and may be appropriately selected from among any of various suitable methods, such as coating with a compound having exactly one Si—N bond or Si—Cl bond per molecule, or contacting with a vapor of the compound having exactly one Si—N bond or Si—Cl bond per molecule. Illustrative examples of the compound having exactly one Si—N bond or Si—Cl bond per molecule include dimethylaminotrimethylsilane, diethylaminotrimethylsilane and chlorotrimethylsilane.

Any suitable method may be employed without particular limitation as the method for treating the interfacial roughness reducing film with the compound having exactly one Si—N bond or Si—Cl bond per molecule. The above-mentioned vapor treatment is preferred. The thickness of the film thus obtained which is made of a compound having exactly one Si—N bond or Si—Cl bond per molecule is not subject to any particular limitation, so long as the film is able to carry out the role of end-capping, and may be thin.

Any method may be used to manufacture semiconductor devices using the interfacial roughness reducing film-forming material, provided the above-indicated conditions are satisfied. Specifically, such a method should include treatment (e.g., vapor treatment) which deposits the above-described interfacial roughness reducing film-forming material on the surface of the insulating film on the semiconductor device. It is advantageous to carry out such treatment while the semiconductor device is in a heated state achieved by heating at a temperature of from 50 to 200° C. for a period of from 0.1 to 20 minutes.

The term 'semiconductor device' as used here encompasses also semiconductor devices in the course of production. Outside of the lower limits in the foregoing ranges, solidification or curing of the interfacial roughness reducing film may be inadequate. Outside of the upper limits in the foregoing ranges, such treatment may not provide the outstanding effects desired and will often adversely impact other processes.

By including such a step, reactions between the insulating film and the interfacial roughness reducing film-forming material are promoted, enabling wiring to be obtained which has a lower leakage current between wiring lines and a higher reliability.

It is preferable for the insulating layer to have silanol groups because the reaction is thereby further promoted. Moreover, for the reasons already mentioned above, it is preferable for the insulating film to be a film that has incurred treatment accompanied by surface roughening.

Preferred conditions for the interfacial roughness reducing film material, the coating method, the film thickness, the atmosphere of the system at the time of coating, and the type and specific dielectric constant of the insulating film have already been described.

In this way, by using the interfacial roughness reducing film-forming material, "an interfacial roughness reducing film in contact on a first side thereof with an insulating film and in contact on a side opposite from the first side with wiring, wherein the interfacial roughness reducing film has a smaller interfacial roughness with the wiring than with the insulating film" can be formed, in addition to which a wiring layer having a low leakage current and a high TDDB resistance can be obtained. By using such a wiring layer, semiconductor devices having a low power consumption and a high reliability can be manufactured. The interfacial roughness reducing film can be advantageously employed in, for example, highly integrated semiconductor devices such as IC and LSI chips.

The interfacial roughness reducing film-forming material, particularly when used in a process which includes, in order:
(I) a step in which wiring trenches and via holes are formed in the semiconductor device by etching,
(II) a step in which an interfacial roughness reducing film is formed, and
(III) a step in which a barrier metal layer is formed, can be advantageously employed in the manufacture of actual semiconductor devices and is thus effective. Specifically, the roughness of wiring trenches due to etching can be reduced, enabling the formation of a LSI wiring layer having a lower current leakage between wiring lines and a higher reliability.

EXAMPLES

Examples and comparative examples are described below.

Example 1

A coatable low-k dielectric material composed of a silicon-containing compound having a specific dielectric constant of 2.5 was spin-coated onto a low-resistance substrate to a film thickness of 250 nm and prebaked at 250° C. for 3 minutes, then cured in an electric furnace under a $N_2$ atmosphere at 400° C. for 30 minutes. The resulting coat was then full-surface etched to a thickness of 200 nm.

In the subsequent steps, a sample not treated at all was prepared as Sample 1, a sample obtained by subjecting a substrate heated at 150° C. to one minute of vapor treatment with hexamethyldisilane (HMDS) was prepared as Sample 2, a sample obtained by subjecting a substrate heated at 150° C. to one minute of vapor treatment with bis(dimethylamino)dimethylsilane was prepared as Sample 3, a sample obtained by subjecting a substrate heated at 150° C. to 40 seconds of vapor treatment with bis(dimethylamino)dimethylsilane followed immediately by 20 seconds of vapor treatment with dimethylaminotrimethylsilane was prepared as Sample 4, a sample obtained by subjecting a substrate heated at 150° C. to 40 seconds of vapor treatment with dimethyldichlorosilane followed immediately by 20 seconds of vapor treatment with dimethylaminotrimethylsilane was prepared as Sample 5, a sample obtained by subjecting a substrate heated at 150° C. to 40 seconds of vapor treatment with (dimethylamino)chlorodimethylsilane followed immediately by 20 seconds of vapor treatment with dimethylaminotrimethylsilane was prepared as Sample 6, a sample obtained by subjecting a substrate heated at 150° C. to 40 seconds of vapor treatment with 1,1,3,3,5,5-hexamethylcyclotrisilazane followed immediately by 20 seconds of vapor treatment with dimethylaminotrimethylsilane was prepared as Sample 7, and a sample obtained by spin coating a solution of 27% dimethyldiacetoxysilane in 3-pentanone onto a substrate, then baking in a nitrogen atmosphere at 125° C., 200° C. and 350° C. for 1 minute each was prepared as Sample 8. In addition, a sample obtained by similarly forming the above-described coatable low-k dielectric material into a film having a thickness of 200 nm then curing at 400° C. for 30 minutes, but not subjected to any further treatment thereafter was prepared as Sample 9. In the preparation of the above samples, the system was held under a nitrogen atmosphere during vapor treatment. The sample film had a maximum thickness of 10 nm.

Using a metal mask, gold was vapor-deposited to a film thickness of 100 nm on the surface of the insulating film in above Samples 1 to 9, following which the specific dielectric constant and the time-dependent dielectric breakdown (TDDB) (400 K) were measured. The dielectric constant and the median time (in seconds) until time-dependent dielectric breakdown (TDDB) obtained using the resulting film are shown in Table 1. Measurements of the specific dielectric constant were carried out using an Agilent 4284A LCR meter (Agilent Technologies). The electrical field-current properties for obtaining the TDDB were measured with an Agilent 4156C Precision Semiconductor Parameter Analyzer (Agilent Technologies). The TDDB was measured in an electrical field of 3.3 MV/cm. Surface shape measurements for the surfaces of above Samples 1 to 9 were carried out using a probe microscope (SPM-9500, Shimadzu Corporation). The surface Ra values obtained are shown in Table 1.

From these results, the roughnesses of Samples 3, 4, 5, 6 and 7 were comparable with that of Sample 9, which was not etched. The reason that HMDS did not provide good results is thought to be that, although surface modification can be carried out with HMDS, the roughness cannot be reduced. In this example, because wiring is provided on the samples, the roughness Ra of Sample 1 corresponds to the "interfacial roughness between the insulating film and the interfacial roughness reducing film", and the roughnesses Ra of Samples 3 to 7 correspond to the "interfacial roughness between the wiring and the interfacial roughness reducing film."

In Samples 3 to 8, the presence of Si—O bonds was confirmed by Fourier transform infrared (FT-IR) spectroscopy.

The average molecular weights and number of silicon atoms per molecule for the compounds used on the respective samples are shown in Table 1. Table 1 also shows which of formulas (1), (2) and (3) each compound had. The nitrogen and chlorine concentrations in the interfacial roughness reducing films in Samples 3 to 7 were each 500 ppm by weight or less.

TABLE 1

| Sample | Material | Specific dielectric constant | TDDB (s) | Ra (nm) | Weight-average molecular weight | Number of Si atoms per molecule | Bonds |
|---|---|---|---|---|---|---|---|
| 1 | None | 3.8 | 84 | 10.1 | — | — | — |
| 2 | HMDS | 2.9 | 157 | 9.7 | 161.39 | 2 | — |
| 3 | Bis(dimethylamino)dimethylsilane | 2.9 | 278 | 0.61 | 146.31 | 1 | N—Si—N |
| 4 | Bis(dimethylamino)dimethylsilane + dimethylaminotrimethylsilane | 2.6 | 423 | 0.59 | 146.31 | 1 | N—Si—N |
| 5 | Dimethyldichlorosilane + dimethylaminotrimethylsilane | 2.6 | 461 | 0.65 | 129.06 | 1 | N—Si—N Cl—Si—Cl |

TABLE 1-continued

| Sample | Material | Specific dielectric constant | TDDB (s) | Ra (nm) | Weight-average molecular weight | Number of Si atoms per molecule | Bonds |
|---|---|---|---|---|---|---|---|
| 6 | (Dimethylamino)dimethylchlorosilane + dimethylaminotrimethylsilane | 2.6 | 450 | 0.64 | 137.68 | 1 | N—Si—Cl |
| 7 | 1,1,3,3,5,5-hexamethylcyclotrisilazane + dimethylaminotrimethylsilane | 2.7 | 385 | 1.01 | 219.51 | 3 | N—Si—N |
| 8 | Dimethyldiacetoxysilane | 3.0 | 192 | 2.62 | | — | C—O—Si—O—C |
| 9 | No etching | 2.5 | 455 | 0.53 | | — | — |

Example 2

Using, as examples of compounds having the respective formulas, the formula (5) compound methyltrichlorosilane, the formula (6) compound tetrachlorosilane, the formula (8) compound (dimethylamino)methyldichlorosilane, the formula (9) compound (dimethylamino)trichlorosilane, the formula (II) compound bis(dimethylamino)methylchlorosilane, the formula (12) compound bis(dimethylamino)dichlorosilane, the formula (13) compound tris(dimethylamino)methylsilane, the formula (14) compound tris(dimethylamino) chlorosilane and the formula (15) compound tetrakis(dimethylamino)silane, tests were carried out in the same way as in Example 1. Results similar to those for Samples 3 to 7 were obtained. The nitrogen and chlorine concentrations in the interfacial roughness reducing films in the respective samples were each 500 ppm by weight or less.

Example 3

FIGS. 1 to 10 illustrate a method of manufacturing an exemplary multilevel metallization structure. First, a transistor layer which is isolated by an isolation dielectric 2 and on which is formed a gate electrode 4 having a source diffusion layer 5a, a drain diffusion layer 5b and a sidewall dielectric 3 was formed on a silicon wafer 1 (Step 1). An interlayer insulating film 6 (phosphorus glass) and a stopper film 7 were then formed on the silicon wafer 1 (Step 2), after which an electrode lead-out contact hole 21 was formed (Step 3).

A 10 nm layer of TiN 8 was subsequently formed by sputtering in the contact hole (Step 4), then the contact hole was filled with a conductor plug 9 by mixing and reducing WF$_6$ with hydrogen (Step 5), following which areas other than the via 25 were removed by CMP (Step 6). Next, a low-k film (isolation dielectric) 10 was formed on the silicon wafer to a thickness of 80 nm, then 20 nm of TEOS-SiO$_2$ 11 was deposited thereon as a protective film for the interlayer insulating film (Step 7).

Using as the mask a resist layer having a first layer wiring pattern, this film was etched with a fluorine plasma obtained using CF$_4$/CHF$_3$ gas as the starting material, thereby forming wiring trenches 22 (Step 8). These wiring trenches 22 were subjected to the Sample 3 treatment in Example 1, forming an interfacial roughness reducing film 12 (Step 9). The interfacial roughness reducing film 12 had a maximum thickness of 3 nm.

In addition, a 10 nm thick film of TiN 8 intended to function as a copper barrier metal to the insulating film and a seed layer 23 (10 nm layer of copper) intended to function as an electrode during electroplating were each formed on the wiring trench by sputtering (Step 10). A copper layer 17 (300 nm) was then deposited by electroplating (Step 11), following which the metal in areas other than the wiring pattern was removed by CMP to form a wiring layer 24 (Step 12).

Next, a dual damascene process in which a via layer and a wiring layer are formed at the same time is described.

A cap layer 19 (SiN) was formed to a thickness of 20 nm on the first wiring layer so as to prevent copper diffusion, then a SiOC layer 13 formed by plasma chemical vapor deposition (plasma CVD) was deposited thereon to a thickness of 100 nm. A SiN film 14 was then deposited to a thickness of 20 nm as a stopper film by plasma CVD using silane and ammonia gas. Next, a low-k dielectric 15 was deposited on the silicon wafer under conditions that provided a film thickness of 100 nm, after which TEOS-SiO$_2$ 16 was deposited to a thickness of 20 nm as a protective film for the interlayer insulating film (Step 13).

Using as the mask a resist layer having a via pattern, the SiO$_2$ film 16/low-k dielectric 15/SiN film 14/SiOC film 13/cap layer 19 were then etched in this order by varying the gas composition of, as the etchant, a fluorine plasma prepared from CF$_4$/CHF$_3$ gas as the starting material (Step 14). Next, using as the mask a resist layer having a second wiring layer pattern, additional etching was carried out with a fluorine plasma prepared from CF$_4$/CHF$_3$ gas as the starting material (Step 15).

An interfacial roughness reducing film 20 was then deposited on this via hole 30 and the wiring trench 26 by carrying out Sample 3 treatment in Example 1, in addition to which a 10 nm layer of TiN 8 intended to serve as a copper barrier metal to the insulating film and a 10 nm seed layer 27 (Cu) intended to serve as an electrode during electroplating were formed by sputtering (Step 16). The interfacial roughness reducing film 20 had a maximum thickness of 3 nm.

A copper layer 18 was then deposited to a thickness of 600 nm by electroplating (Step 17), following which metal was removed in areas other than the wiring pattern by CMP, thereby forming vias 28 and a wiring layer 29 (Step 18). The above-described steps were subsequently repeated so as to form three-layer wiring. Measurement of the TDDB at an applied voltage of 3.3 MV/cm using the resulting test-produced comb-shaped multilayer wiring pattern yielded a median value for the time until breakdown of 197 seconds.

Example 4

Aside from forming interfacial roughness reducing layers 12 and 20 using Sample 4 in Example 1, three-layer wiring was formed in exactly the same way as in Example 3. TDDB measurement using the resulting test-produced comb-shaped multilayer wiring pattern yielded a median value for the time until breakdown of 438 seconds.

Example 5

Aside from forming interfacial roughness reducing layers 12 and 20 using Sample 5 in Example 1, three-layer wiring was formed in exactly the same way as in Example 3. TDDB measurement using the resulting test-produced comb-shaped multilevel wiring pattern yielded a median value for the time until breakdown of 415 seconds.

Comparative Example 1

Aside from not forming interfacial roughness reducing films 12 and 20, three-layer wiring was formed in exactly the same way as in Example 3. TDDB measurement using the resulting test-produced comb-shaped multilevel wiring pattern yielded a median value for the time until breakdown of 58 seconds.

Comparative Example 2

Aside from forming interfacial roughness reducing layers 12 and 20 using Sample 9 in Example 1, three-layer wiring was formed in exactly the same way as in Example 3. TDDB measurement using the resulting test-produced comb-shaped multilevel wiring pattern yielded a median value for the time until breakdown of 81 seconds.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

The invention claimed is:

1. An interfacial roughness reducing film in contact, on one side thereof, with an insulating film and in contact, on a side opposite from the one side, with wiring,
    the interfacial roughness reducing film comprising a Si—O bond, and being formed using a composition comprising a silicon compound that comprises at least one bond of Si—N bonds and Si—Cl bonds wherein the number of Si—N bonds and Si—Cl bonds combined per molecule of the compound is at least two, and
    an interfacial roughness between the interfacial roughness reducing film and the wiring being smaller than that between the interfacial roughness reducing film and the insulating film.

2. The interfacial roughness reducing film of claim 1, wherein the silicon compound has an average molecular weight of not more than 300 and includes not more than five silicon atoms thereof per molecule.

3. The interfacial roughness reducing film of claim 1, wherein the silicon compound includes at least one moiety thereof per molecule represented by at least one of formulas (1) to (3) below:

N—Si—N         (1)

N—Si—Cl         (2)

Cl—Si—Cl         (3)

(where each silicon valence bond not shown in formulas (1) to (3) is optionally a bond with nitrogen or chlorine).

4. The interfacial roughness reducing film of claim 1, wherein the silicon compound includes at least one moiety thereof per molecule represented by at least one of formulas (4) to (15) below:

(4)

(5)

(6)

(7)

(8)

(9)

(10)

(11)

(12)

(13)

(14)

(15)

(where each of $R^1$ to $R^{48}$ in formulas (4) to (15) is, independently in and among the respective formulas, selected from the group consisting of alkyls having from 1 to 20 carbons, alkenyls, alkynyls, alkylcarbonyls, alkenylalkyls and alkynylalkyls having from 2 to 20 carbons, and aryls having from 6 to 20 carbons).

5. The interfacial roughness reducing film of claim 1, wherein the silicon compound includes at least one moiety thereof per molecule represented by at least one of formulas (4) to (15) below:

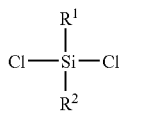
(4)

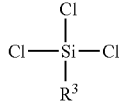
(5)

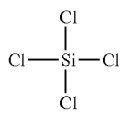
(6)

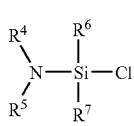
(7)

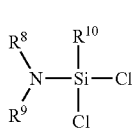
(8)

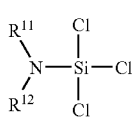
(9)

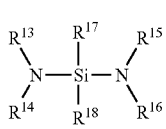
(10)

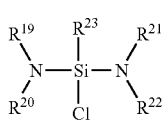
(11)

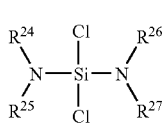
(12)

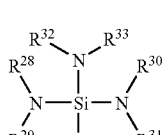
(13)

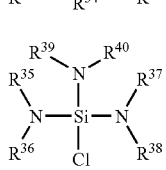
(14)

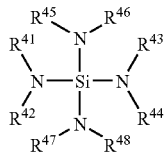
(15)

(where each of $R^1$ to $R^{48}$ in formulas (4) to (15) is, independently in and among the respective formulas, selected from the group consisting of alkyls having from 1 to 3 carbons, alkenyls, alkynyls and alkylcarbonyls having from 2 to 4 carbons, alkenylalkyls and alkynylalkyls having from 3 to 6 carbons, and aryls having from 6 to 10 carbons).

6. The interfacial roughness reducing film of claim 1, which contains nitrogen and chlorine in respective amounts of not more than 500 ppm by weight.

7. The interfacial roughness reducing film of claim 1, which is provided following treatment accompanied by surface roughening of the insulating film.

8. The interfacial roughness reducing film of claim 1, which has an average film thickness in a range of from 0.1 to 50 nm.

9. A semiconductor device which comprises the interfacial roughness reducing film of claim 1.

10. A method of manufacturing a semiconductor device which comprises an interfacial roughness reducing film in contact, on one side thereof, with an insulating film and in contact, on a side opposite from the one side, with wiring, the interfacial roughness reducing film comprising a Si—O bond, and being formed using a composition comprising a silicon compound that comprises at least one bond of Si—N bonds and Si—Cl bonds wherein the number of Si—N bonds and Si—Cl bonds combined per molecule of the compound is at least two, and an interfacial roughness between the interfacial roughness reducing film and the wiring being smaller than that between the interfacial roughness reducing film and the insulating film, the method comprising:
treating a surface of the insulating film of the semiconductor with the composition while heating the surface at a temperature of from 50 to 200° C.

11. The semiconductor device manufacturing method of claim 10, further comprising, following said treatment, treating the surface of the interfacial roughness reducing film with a compound having exactly one Si—N bond or Si—Cl bond per molecule.

12. The semiconductor device manufacturing method of claim 11, wherein at least one of the two treatments is vapor treatment.

13. The semiconductor device manufacturing method of claim 11 or claim 12, wherein the insulating film is at least one of an interlayer insulating film and a protecting film for an interlayer insulating film and, said treatment accompanying surface roughening is etching or chemical mechanical polishing.

14. The semiconductor device manufacturing method of claim 11, wherein the insulating film is a low-dielectric constant insulating film having a specific dielectric constant of not more than 2.7.

15. The semiconductor device manufacturing method of claim 11, wherein the insulating film has pores.

16. The semiconductor device manufacturing method of claim 11, wherein the insulating film is obtained by:
coating onto a substrate to be processed a liquid composition containing an organosilicon compound prepared by hydrolyzing, in the presence of a tetraalkylammonium hydroxide, one or more silane compounds of the following formulas (16) to (19);

heat-treating the film of liquid composition coated onto the substrate to be processed at a temperature of at least 80° C. but not more than 350° C.; and baking the heat-treated film at a temperature above 350° C. but not more than 450° C.

* * * * *